(12) United States Patent
Wang et al.

(10) Patent No.: US 12,039,242 B2
(45) Date of Patent: Jul. 16, 2024

(54) STRUCTURE AND METHOD OF NON-RECTANGULAR CELL IN SEMICONDUCTOR DEVICE

(71) Applicant: TAIWAN SEMICONDUCTOR MANUFACTURING COMPANY LTD., Hsinchu (TW)

(72) Inventors: Pochun Wang, Hsinchu (TW); Jerry Chang Jui Kao, Taipei (TW); Jung-Chan Yang, Taoyuan County (TW); Hui-Zhong Zhuang, Kaohsiung (TW); Tzu-Ying Lin, Hsinchu (TW); Chung-Hsing Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 853 days.

(21) Appl. No.: 17/008,067

(22) Filed: Aug. 31, 2020

(65) Prior Publication Data
US 2022/0067259 A1   Mar. 3, 2022

(51) Int. Cl.
*G06F 30/392*   (2020.01)
*G06F 30/3953*  (2020.01)
*H01L 27/02*    (2006.01)
*H01L 29/40*    (2006.01)
*H01L 29/417*   (2006.01)
(Continued)

(52) U.S. Cl.
CPC ........ *G06F 30/392* (2020.01); *G06F 30/3953* (2020.01); *H01L 27/0207* (2013.01); *H01L 29/401* (2013.01); *H01L 29/41775* (2013.01); *H01L 29/4238* (2013.01); *H01L 27/092* (2013.01)

(58) Field of Classification Search
CPC ............... G06F 30/392; G06F 30/3953; H01L 27/0207; H01L 29/401; H01L 29/41775; H01L 29/4238; H01L 27/092
See application file for complete search history.

(56) References Cited

U.S. PATENT DOCUMENTS 5,412,239 A * 5/1995 Williams ............ H01L 29/7801
                                                257/E29.12
8,836,029 B2 * 9/2014 Illegems ............ H01L 29/41758
                                                257/349
(Continued)

*Primary Examiner* — Nha T Nguyen
(74) *Attorney, Agent, or Firm* — WPAT LAW; Anthony King

(57) ABSTRACT

A layout method includes generating a design data comprising an electronic circuit, and generating a design layout by placing a first cell corresponding to the electronic circuit. The first cell includes a first source/drain region and a second source/drain region extending in a first direction in a first layer, a gate electrode extending in a second direction perpendicular to the first direction in a second layer, and a first conductive line arranged in a third layer over the second layer and electrically connected to one of the first source/drain region, the second source/drain region and the gate electrode. The first cell is defined by a left cell side and a right cell side. At least one of the left cell side, the right cell side, the gate electrode and the first conductive line extends in a third direction not parallel to the first and second directions.

20 Claims, 17 Drawing Sheets

(51) Int. Cl.
  *H01L 29/423*    (2006.01)
  *H01L 27/092*    (2006.01)

(56) References Cited

U.S. PATENT DOCUMENTS

| | | | | |
|---|---|---|---|---|
| 2006/0257790 | A1* | 11/2006 | Tien | H01L 27/118 |
| | | | | 430/311 |
| 2008/0185688 | A1* | 8/2008 | Kuesel | G06F 30/392 |
| | | | | 716/120 |
| 2009/0168480 | A1* | 7/2009 | Scheuerlein | G11C 8/08 |
| | | | | 257/E21.235 |
| 2012/0127778 | A1* | 5/2012 | Miyata | H10B 63/82 |
| | | | | 365/148 |
| 2013/0021839 | A1* | 1/2013 | Ishikura | H10B 10/12 |
| | | | | 365/154 |
| 2016/0005748 | A1* | 1/2016 | Chen | H10B 43/27 |
| | | | | 257/324 |
| 2018/0122793 | A1* | 5/2018 | Moroz | H01L 29/78642 |
| 2020/0019665 | A1* | 1/2020 | Anderson | G06F 30/392 |
| 2023/0380976 | A1* | 11/2023 | de Boer | C12M 23/02 |

\* cited by examiner

STRUCTURE AND METHOD OF NON-RECTANGULAR CELL IN SEMICONDUCTOR DEVICE

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of designing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
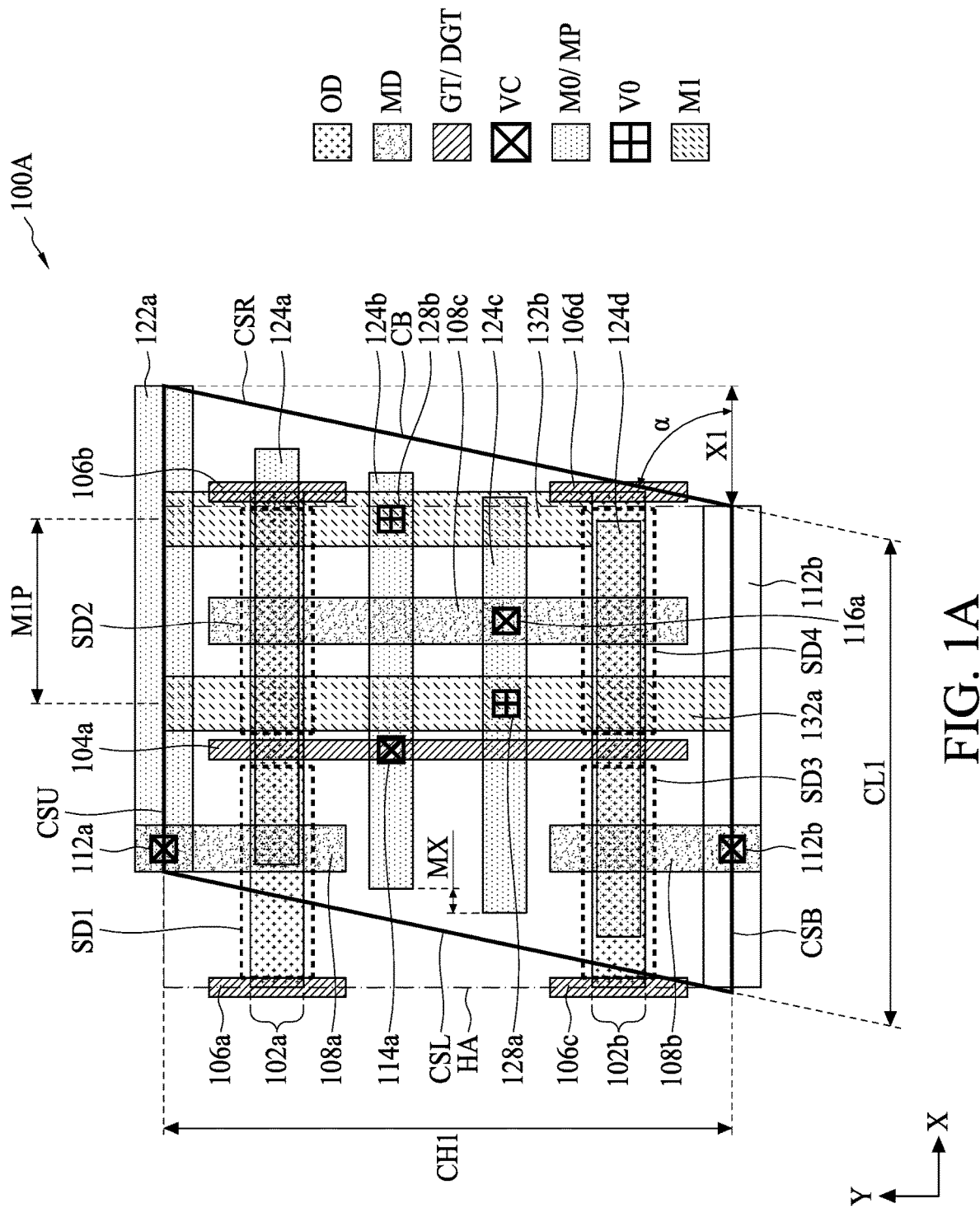
FIG. 1A is a schematic diagram of a design layout of a standard cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Throughout the present disclosure, if several features of a same type are introduced, they are labeled by the same generic numerals and differentiated by postfixes of different lower-case letters. For example, the features 102a and 102b may refer to two instances of a same type feature in a semiconductor device, in which the instances 102a and 102b may have the same or different configurations, such as the dimension or material. In some cases, if one or more features are referred to by a three-digit numeral only, it is intended to mean the union set of such features, e.g., the description "feature 102" refers to the collection of the features 102a and 102b.

The term "standard cell" or simply "cell" used throughout the present disclosure refers to a group of circuit patterns in a design layout to implement specific functionalities of a circuit. A cell is generally comprised of one or more layers, and each layer includes various patterns expressed as polygons of the same or various shapes. A design layout may be generated by placement of one or more cells in allocated locations of a blank layout. In some cases, after the placement step, the placed cells are electrically connected using an interconnect structure. The geometries of the patterns in the cells may be adjusted at different stages of a design flow in order to compensate for design and process effects. The cells may be accessible from cell libraries provided by semiconductor manufacturers or designers. In some cases, the cell library may be stored in a non-transitory computer-readable storage medium and accessed by a processor in various circuit design stages.

Throughout the present disclosure, the cells are designed for implementing electronic circuits formed by semiconductor devices, e.g., a metal-oxide-semiconductor (MOS) field-effect transistor (FET) device, and can be a planar FET device, a fin-type FET (FinFET) device, a gate-all-around (GAA) device, a nanowire device, a fully-depleted silicon-on-isolator (FDSOI) device, or the like.

FIG. 1A is a design layout of a cell 100A, in accordance with some embodiments of the present disclosure. In some embodiments, the cell 100A is used for manufacturing an electronic circuit, such as an inverter gate. Although the inverter gate is used in the present example, the cell 100A is also applicable to other types of electronic circuits, such as a NAND gate, an XOR gate, an AND gate, a NOR gate, an AND-OR-Inverter (AOI) gate, or other suitable logic gate devices.

Referring to FIG. 1A, the cell 100A includes multiple layers overlaid with one another along with various patterns in the respective layers from a top-view perspective. The features of the cell 100A include active regions (OD) 102, a gate electrode (GT) 104a, dummy gate electrodes (DGT) 106, gate-layer conductive lines (MD) 108, power rails 122, conductive lines 124 and 132, and conductive vias 112, 114, 116 and 128.

Figure 1B:
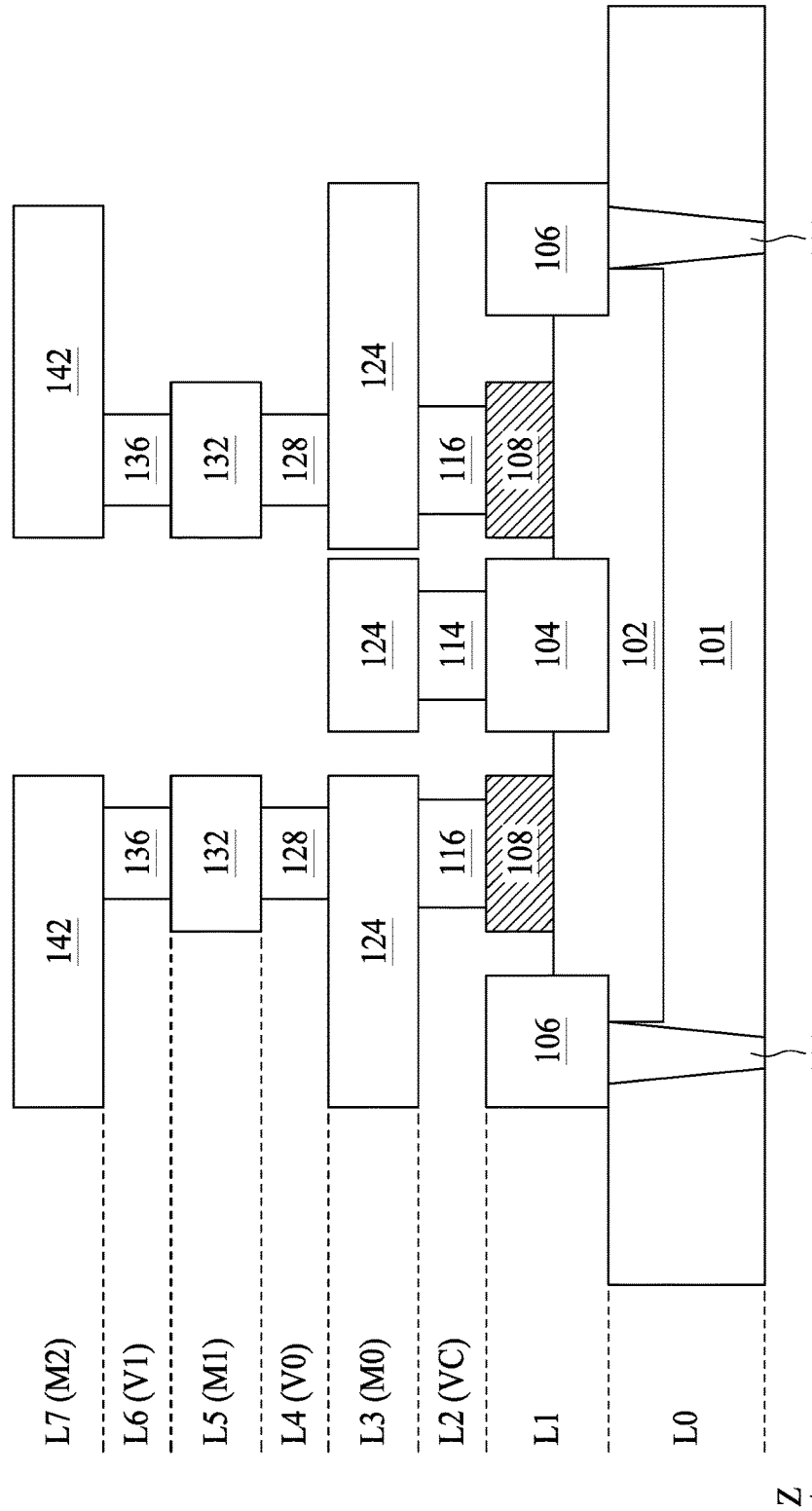
FIG. 1B is a cross-sectional view showing a vertical layer arrangement of a semiconductor device, in accordance with some embodiments of the present disclosure.

FIG. 1B is a cross-sectional view 100B showing a vertical arrangement of exemplary features in the respective layers of the cell 100A, in accordance with some embodiments of the present disclosure. The features shown in FIG. 1B are used for illustrate generic spatial relationships only and may not necessarily follow a specific cross-sectional line in FIG. 1A. Further, the features shown in FIG. 1B are labeled by generic numerals without specifying specific instances. The vertical arrangement as shown in FIG. 1B is also applicable to other cells throughout the present disclosure unless explicitly specified otherwise.

Referring to FIG. 1B, a substrate layer L0 is formed or provided. The substrate layer L0 includes a substrate 101, which may be formed of a silicon substrate or other suitable semiconductor substrate. An active region (OD) 102 is arranged in the substrate 101 and exposed through an upper surface of the substrate 101. Although not separately shown in FIG. 1B, the active region 102 may include a first source/drain region, a second source/drain region and a channel region interposed between the two source/drain regions. The source/drain regions in the active region 102 may be an N-type active region doped with N-type impurities such as arsenic, phosphorus, or the like, or a P-type active region doped with P-type impurities such as boron or the like. The channel region in the active region 102 may be undoped or lightly doped. In the depicted embodiment, a raised active region 102 is implemented for a planar or fin-type field-effect transistor (FinFET) device, in which the source/drain regions may have an upper surface higher than the upper surface of the substrate 101 and protrude into a gate layer L1 over the substrate layer L0. In some embodiments, the substrate layer L0 further includes isolation structures 111 in the substrate 101 to define and laterally surround the active region 102. In some embodiments, the isolation structures 111 are formed of dielectric materials, such as oxide or nitride, and may be referred to as shallow trench isolation (STI).

A gate electrode (GT) 104 is provided in the gate layer L1 over the active region 102. The gate electrode 104 may be formed of a conductive material, such as doped polysilicon or formed of a metal gate comprising metallic materials such as tungsten and cobalt, and other work function adjusting metals, such as Ti, Al, TiAl, TiN, TaC, and the like.

Dummy gate electrodes (DGT) 106 are arranged in the gate layer L1 on opposite sides of the active region 102. The dummy gate electrodes 106 are parallel to the gate electrode 104. In some embodiments, the dummy gate electrodes 106 are formed of a material the same as or different from that of the electrode gate 104. In contrast to the gate electrode 104 which serves functions in forming a FET device, the dummy gate electrodes 106 do not serve any functions in forming a FET device. In some embodiments, the dummy gate electrode 106 is arranged on a cell edge, and may be referred to as a cell-edge gate electrode.

Further, a gate-layer conductive line (MD) 108 is also provided in the gate layer L1 over the active region 102 adjacent to the gate electrode 104. The gate-layer conductive line 108 is used to electrically connect the source/drain region of the active region 102 to overlying features. Although not explicitly shown in FIG. 1B, a gate dielectric film formed of dielectric materials may be arranged between the channel region and the gate electrode 104. In some embodiments, the substrate layer L0 and the gate layer L1 is collectively referred to as a transistor layer, in which one or more FET devices reside.

An interconnect structure is provided over the gate layer L1 for electrically connect the transistor layer to other features. The interconnect structure generally includes a plurality of conductive line layers, e.g., layers L3, L5 and L7, and a plurality of conductive via layers, e.g., layers L2, L4 and L6. Each of the conductive line layers L3, L5 and L7 includes a plurality of parallel conductive lines, e.g., power rails (MP) 122 and conductive lines (M0) 124, conductive liens (M1) 132 and conductive lines (M2) 142, and each of the conductive via layers L2, L4 and L6 includes one or more conductive vias, e.g., the conductive vias 112 (VC), 114 (VC), 116 (VC), 128 (V0) and 136 (V1). These conductive lines (including the gate-layer conductive line 108) of the conductive line layers and the conductive vias of the conductive via layers may be formed of conductive materials, such as doped polysilicon, copper, tungsten, aluminum, titanium, tantalum, titanium nitride, tantalum nitride, alloys thereof, or the like.

The aforementioned conductive line layers L3, L5 and L7 may be electrically interconnected through the conductive vias 112, 114, 116, 128 and 136. Two conductive lines in adjacent conductive line layers are interconnected through one or more conductive vias in the intervening conductive via layer. For example, the gate-layer conductive lines 108 and the power rail 122 are electrically connected through the conductive via 112, the conductive lines 124 and 132 are electrically connected through the conductive via 128, and the conductive lines 132 and 142 are electrically connected through the conductive via 136.

Referring to FIG. 1A, two active regions (OD) 102a and 102b are arranged in the substrate layer L0 of the cell 100A. The active regions 102a and 102b may extend in a row direction along the x-axis. The active regions 102a and 102b are defined and separated from each other by the isolation structures 111 (not separately shown in FIG. 1A but shown in FIG. 1B). In some embodiments, the active regions 102a and 102b include the same or different conductivity types, e.g., the active regions 102a and 102b are a P-type active region and an N-type active region, respectively. However, in other embodiments, the active regions 102a and 102b are an N-type active region and a P-type active region, respectively.

The gate electrode (GT) 104a is disposed in the gate layer L1 over the active regions 102a and 102b. The gate electrode 104a extends in a column direction along the y-axis perpendicular to the x-axis. In some embodiments, the gate electrode 104a serves as a functional gate electrode in forming a FET device.

The dummy gate electrodes (DGT) 106, i.e., 106a, 106b, 106c and 106d are arranged in the gate layer L1 and extending in the column direction on left sides or right sides of the active regions 102a and 102b. The dummy gate electrodes 106 are parallel to the gate electrode 104a. In some embodiments, the dummy gate electrodes 106a and 106c are aligned in the column direction and the dummy gate electrodes 106c and 106d are aligned in the column direction.

Source/drain regions SD1 and SD2 are formed in the active region 102a and delimited by the gate electrode 104a and the dummy gate electrodes 106, in which the source/drain regions SD1 and SD2 extend in the row direction and correspond to the source region and drain region, respectively, of a P-type FET device of the inverter according to some embodiments. The active region 102a covered by the gate electrode 104a between the source/drain regions SD1 and SD2 is defined as the channel region of the P-type FET device. Similarly, Source/drain regions SD3 and SD4 are formed in the active region 102b and delimited by the gate electrode 104a and the dummy gate electrodes 106, in which the source/drain regions SD3 and SD4 extend in the row direction and correspond to the source region and drain region, respectively, of an N-type FET device of the inverter according to some embodiments. The active region 102b covered by the gate electrode 104a between the source/drain regions SD3 and SD4 is defined as the channel region of the N-type FET device.

The gate-layer conductive lines (MD) 108 are arranged in the gate layer L1. The gate-layer conductive lines 108 are arranged parallel to the gate electrodes 104a. For example, gate-layer conductive lines 108a and 108b overlap the source/drain regions SD1 and SD3, respectively, and a gate-layer conductive line 108c overlaps the source/drain regions SD2 and SD4. Referring to FIGS. 1A and 1B, the gate-layer conductive line 108a extends over and is electrically connected to the source/drain region SD1, and the gate-layer conductive line 108b extends over and is electrically connected to the source/drain region SD3. The gate-layer conductive line 108c extends over the source/drain regions SD2 and SD4 and electrically connects the source/drain region SD2 to the source/drain region SD4.

In the present example, the cell 100A is defined by a cell boundary CB constructed by four cell sides, i.e., an upper cell side CSU, the lower (bottom) cell side CSB, a left cell side CSL and a right cell side CSR. The cell 100A has a cell length CL1 of the distance between the left cell side CSL and the right cell side CSR measured in the row direction and a cell width CH1 or cell height of the cell 100A defined as a pitch between the upper cell side CSU and the lower cell side CSB measured in the column direction.

In some embodiments, the boundary CB of the cell 100A is in a non-rectangular quadrilateral shape. In some embodiments, the boundary CB is in parallelogram shape. The cell 100A is thus referred to as a "non-orthogonal" cell structure herein as compared to existing rectangular or orthogonal cell structures where all features in the cell extend in the row direction or the column direction. In other words, the left cell side CSL is parallel to the right cell side CSR, the upper cell side CSU is parallel to the lower cell side CSB, and the left and right cell sides CSL, CSU are non-orthogonal to the upper or lower cell sides CSU, CSB. The left cell side CSL and the right cell side CSR may be inclined or slanted from the y-axis by an angle. In some embodiments, the left or right cell side CSL, CSR forms an included angle $\alpha$ with the cell side CSU or CSB (or equivalently, the x-axis), in which the angle $\alpha$ is different from 90 degrees. In some embodiments, the angle $\alpha$ is an acute angle between about 15 degrees and about 75 degrees, or between about 30 degrees and about 60 degrees.

The power rails (M0) 122 are arranged in the conductive line layer L3 and extending in the row direction. In some embodiments, the power rails 122a and 122b are configured to convey power, i.e., supplying a first voltage VDD and a second voltage VSS, respectively. In some embodiments, the first voltage VDD is a positive voltage and the second voltage VSS is ground. The power rails 122, which include power rails 122a and 122b, are arranged in parallel on the upper cell side CSU and the lower cell side CSB, respectively, of the cell 100A. In some embodiments, the upper cell side CSU is aligned with a centerline of the power rail 122a while the lower cell side CSB is aligned with a centerline of the power rail 122b. In some embodiments, the left cell side CSL runs through a center of a left side of the power rail 122a and a center of a left side of the power rail 122b, and the right cell side CSR runs through a center of a right side of the power rail 122a and a center of a right side of the power rail 122b.

In some embodiments, due to the parallelogram structure of the cell 100A, the left (right) side of the power rail 122a is offset from the left (right) side of the power rail 122b by a distance X1. The distance X1 may be determined so that the right cell side CSR is non-overlapped with any conductive lines, such as the conductive line 132b closest to the right cell side CSR. In some embodiments, the distance X1 is substantially equal to or greater than one-third of the cell length CL1 of the cell 100A.

The conductive lines (M0) 124 are arranged in the conductive line layer L3 and extending in the row direction. In some examples, the conductive lines 124 are configured as data rails for conveying data signals. In some embodiments, the conductive lines 124 (124a, 124b, 124c and 124d) are equally spaced between the power rails 122a and 122b and parallel to the power rails 122a and 122b. In some embodiments, the conductive lines 124 have substantially equal lengths in the row direction and their right (or left) sides are offset in sequence by a uniform distance MX for conforming to the inclined cell sides CSL and CLR.

The conductive lines (M1) 132 are arranged in the conductive line layer L5 and extending in the column direction. In the depicted example, the conductive lines 132, such as conductive lines 132a and 132b, are configured as data rails. However, the conductive lines 132 may be alternatively configured as power rails in other examples. The conductive lines 132 may have a line pitch M1P measured in the row direction in terms of the cell length CL1, e.g., the line pitch M1P is set as one half or one third of the cell length CL1. In some embodiments, the conductive line 132b is parallel to and aligned with the dummy gate electrode 106b or 106d from a top-view perspective.

A first biasing path of the cell 100A for supplying the first voltage VDD is formed between the power rail 122a and the source/drain region SD1 through the conductive vias 112a arranged in the conductive via layer L2 and the gate-layer conductive line 108a in the gate layer L1. A second biasing path of the cell 100A for supplying the second voltage VSS is formed between the power rail 122b and the source/drain region SD3 through the conductive via 112b arranged in the conductive via layer L2 and the gate-layer conductive line 108b in the gate layer L1.

In the present example, the conductive lines 124b and 124c are configured as an input pin and an output pin, respectively, of the cell 100A, in which the conductive line 124b is configured to transmit an input signal to the gate electrode 104a and the conductive line 124c is configured to receive an output signal from the source/drain region SD2 or SD4. The conductive line 124b is electrically connected to the gate electrode 104a through the conductive via 114a in the layer L2. Similarly, the conductive line 124c is electrically connected to the source/drain region SD2 or SD4 through the conductive via 116a in the layer L2 and the gate-layer conductive line 108c in the gate layer L1.

In some embodiments, the conductive line 132a is configured as an output pin in place of the conductive line 124c and is electrically connected to the conductive line 124c through the conductive via 128a arranged in the conductive via layer L4. In some embodiments, the conductive line 132b is configured as an input pin in place of the conductive line 124b and is electrically connected to the conductive line 124b through the conductive via 128b arranged in the conductive via layer L4.

In some embodiments, the maximal number of conductive lines 132 is closely related to the cell length CL1. According to the existing design rule, a cell generally has the conductive lines 132 arranged within the cell boundary CB in order to lower the likelihood of adverse impacting neighboring cells, thereby minimizing the chances of violating the design rules. However, such stringent design rule may impose difficulties to placement of advanced cells with a reduced cell size and a limited number of conductive lines 132.

In view of the above, the parallelogram structure of the cell 100A is proposed to relax the constraint of the locations of the conductive lines 132 so that the conductive line 132b can be arranged within the cell boundary CB. As a result, the conductive line 132b, which is otherwise deemed as a rule-violating conductive line in a rectangular cell structure due to its overlapping with the dummy gate electrode 106b, now becomes a rule-compliant conductive line. Therefore, the number of available conductive lines 132 is increased, and the routing resource is increased accordingly. It should be noted that, although the number of available conductive lines 132 is increased, the effective cell area of the cell 100A is not increased as compared to its counterpart rectangular-shape cell. Thus, the cell 100A is advantageous in routing over existing rectangular-shape cells.

In some embodiments, the cell boundary CB is applicable to the interconnect structure of the cell 100A only. The boundary of the transistor layer in the cell 100A is based on a rectangular area HA delimited by the lower cell side CSB and the dummy gate electrodes 106. As a result, the active region 102a or 102b include a portion protruding from the cell boundary of the cell 100A. For example, the active region 102a and the active region 102b protrude from the left cell side CSL. Although the active regions 102a and 102b are not fully included within the boundary CB of the cell 100A, their electrical performance and abutment with neighboring cells are not adversely affected. Further, the dummy gate electrodes 106 are not arranged on the cell sides of the cell 100A. For example, the dummy gate electrodes 106a and 106c are located outside the cell boundary CB while the dummy gate electrodes 106b and 106d are located inside the cell boundary CB.

Figure 1C:
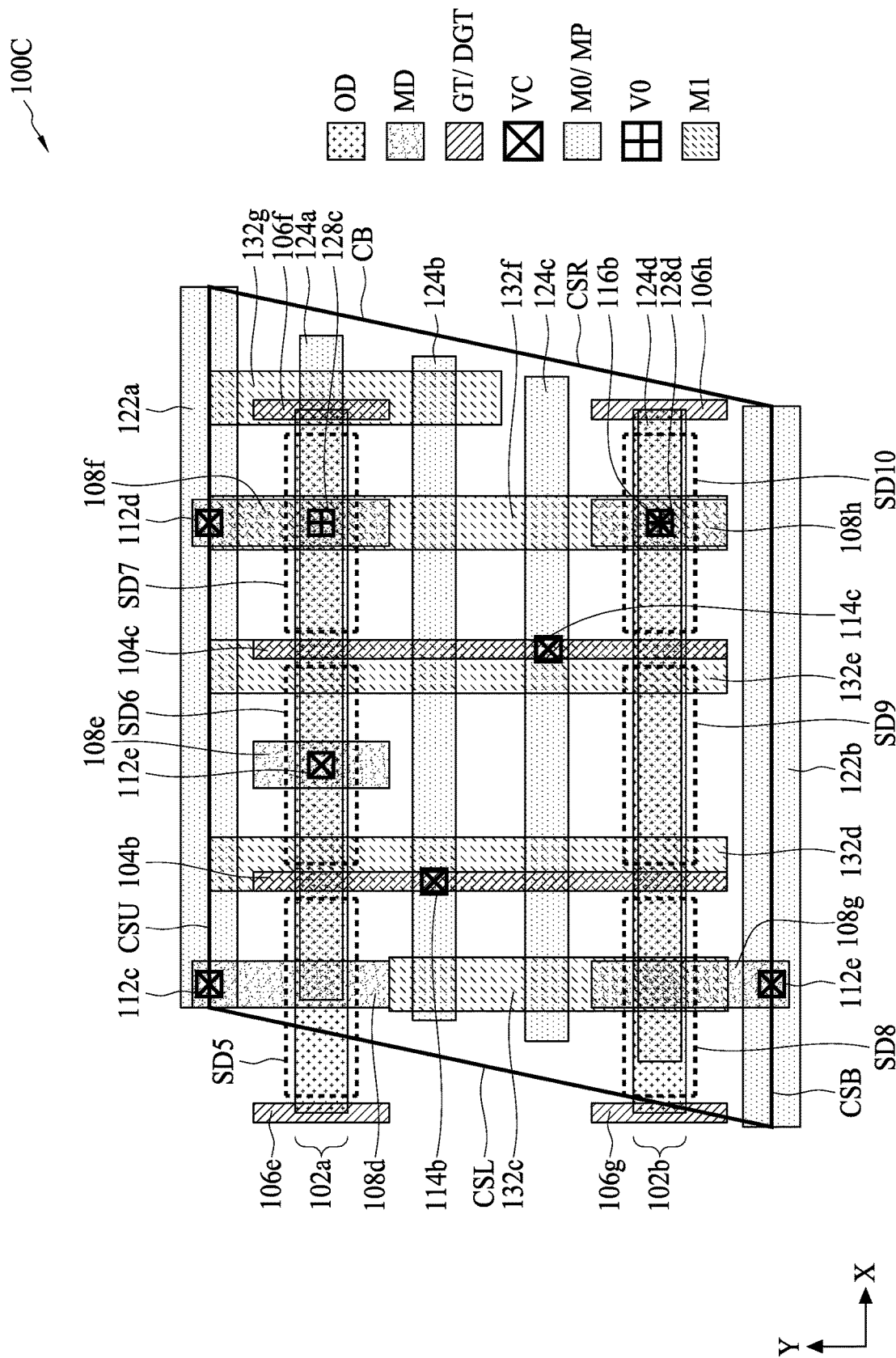
FIG. 1C is a schematic diagram of a design layout of a standard cell, in accordance with some embodiments of the present disclosure.

FIG. 1C is a design layout of a cell 100C, in accordance with some embodiments of the present disclosure. The cell 100C is associated with a NAND gate device or other suitable logic gate devices.

The cell 100C includes active regions (OD) 102a and 102b arranged in the substrate layer L0, gate electrodes (GT) 104b and 104c and dummy gate electrodes (DGT) 106e, 106f, 106g and 106h arranged in the gate layer L1, gate-layer conductive lines (MD) 108d, 108e, 108f, 108g and 108h arranged in the gate layer L1. The cell 100C further includes power rails 122a and 122b and conductive lines 124a, 124b, 124c and 124d arranged in the conductive line layer L3, and conductive lines 132c, 132d, 132e, 132f and 132g arranged in the conductive layer L5. The cell 100C also includes conductive vias 112c, 112d, 112e, 114b, 114c and 116b arranged in the conductive via layer L2, and conductive vias 128c and 128d arranged in the conductive via layer L4. The dimensions, configurations, materials and method of forming of the abovementioned features in cell 100C are similar to those of the cell 100A, and their descriptions are omitted for brevity.

Source/drain regions SD5, SD6 and SD7 are formed in the active region 102a, extend in the row direction and delimited by the gate electrodes 104b and 104c and the dummy gate electrodes 106. Portions of the active region 102a covered by the gate electrode 104b or 104c between the source/drain regions SD5, SD6 and SD7 are defined as respective channel regions of two P-type FET devices of the NAND gate device. Similarly, source/drain regions SD8, SD9 and SD10 are formed in the active region 102b, extend in the row direction and delimited by the gate electrodes 104b and 104c and the dummy gate electrodes 106. Portions of the active region 102b covered by the gate electrodes 104b and 104c between the source/drain regions SD8, SD9 and SD10 are defined as respective channel regions of two N-type FET devices of the NAND gate device.

The conductive line 132g is arranged immediately adjacent to the right cell side CSR of the cell 100C and overlapped with the dummy gate electrode 106f. According to the proposed parallelogram structure of the cell 100C, the conductive line 132g is arranged within the cell boundary CB of the cell 100C and thus considered as an additional rule-compliant conductive line for the cell 100C as compared to an existing rectangular-shape cell.

Figure 1D:
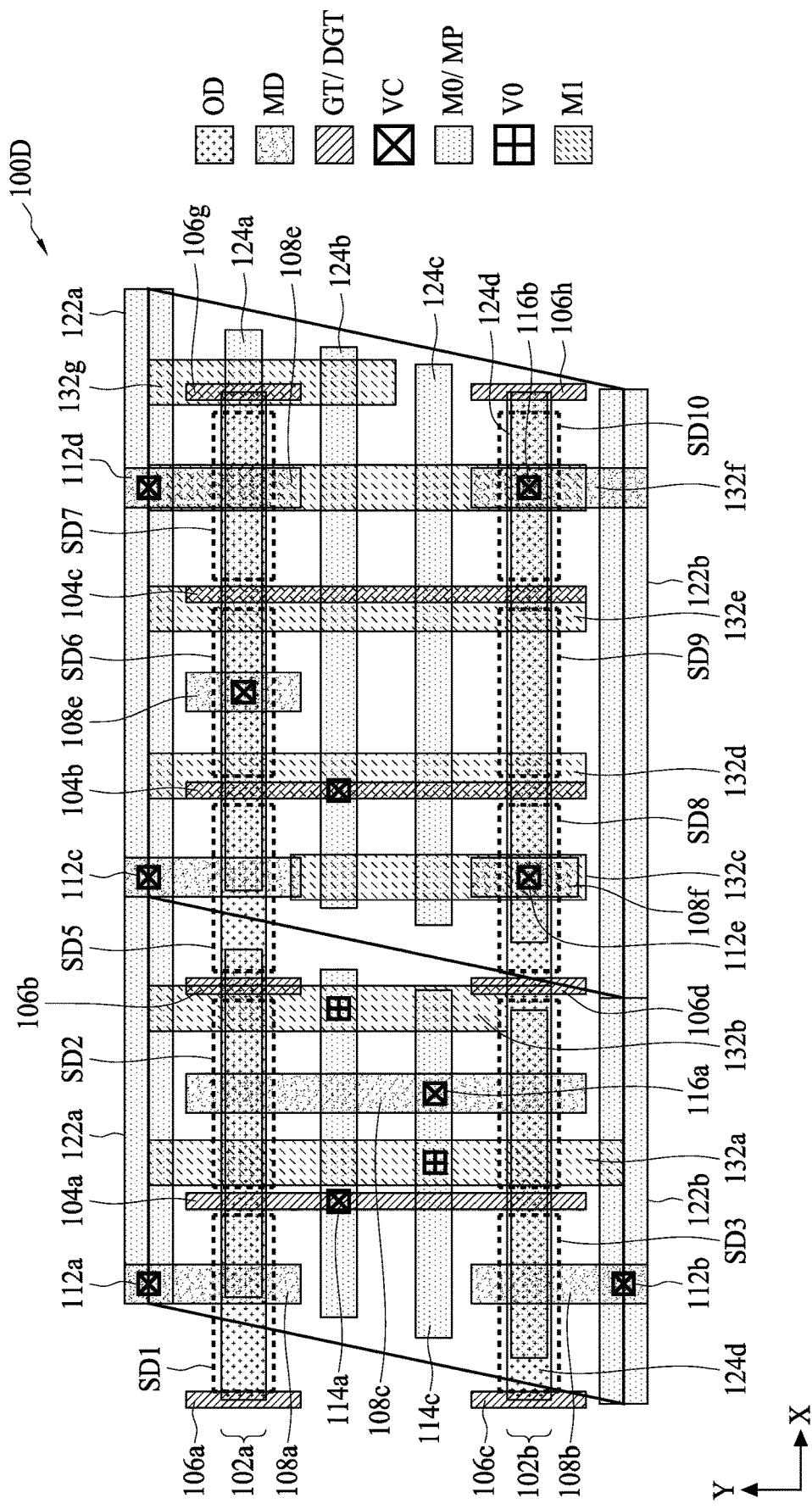
FIG. 1D is a schematic diagram of a design layout in accordance with some embodiments of the present disclosure.

FIG. 1D is a design layout 100D in accordance with some embodiments of the present disclosure. During a placement and routing step of a circuit design procedure, a blank design layout 100D is initially generated, in which the cell 100A or 100C are accessed from a cell library and placed on the design layout 100D. In the depicted embodiments, the cells 100A and 100C are placed in a same row such that the respective upper cell sides CSU and lower cell sides CSB of the cells 100A and 100C are aligned with each other. Further, the right cell side CSR of the cell 100A abuts the left side CSL of the cell 100C. In some embodiments, the right cell side CSR of the cell 100A coincides with the left cell side CSL of the cell 100C. Since the left/right cell sides CSL, CSR of the respective cells 100A and 100C have the same inclined angles α with respect to the x-axis, the cells 100A and 100C can seamlessly abut in the row direction. As a result, the proposed parallelogram cell structures will not consume any additional cell areas as compared to existing cell structures with rectangular cell shapes, except for the layout edges where a small percentage of area overhead may be necessary.

When the cells 100A and 100C are abutted, the dummy gate electrodes 106b and 106d of the cell 100A is merged or overlapped with the dummy gate electrodes 106e and 106g of the cell 100C. Further, the active regions 102a and 102b of the cell 100A is aligned with respective active regions 102a and 102b of the cell 100C. In some embodiments, a portion of the active region 102a of the cell 100C, i.e., the source/drain region SD5, extends into the cell 100A. The functionality of the source/drain region SD5 is not impacted by the abutment of the cells 100A and 100C. With help of the proposed non-orthogonal cell structure, the conductive line 132c of the cell 100C can be regarded as a rule-compliant conductive line for use in intra-cell routing. The conductive line 132c therefore provides an additional access pin for intra-cell routing. Thus, the utilization of the conductive lines of the cell 100C or the entire design layout 100D is enhanced on account of the additional conductive lines 132c and 132g.

Figure 2A:
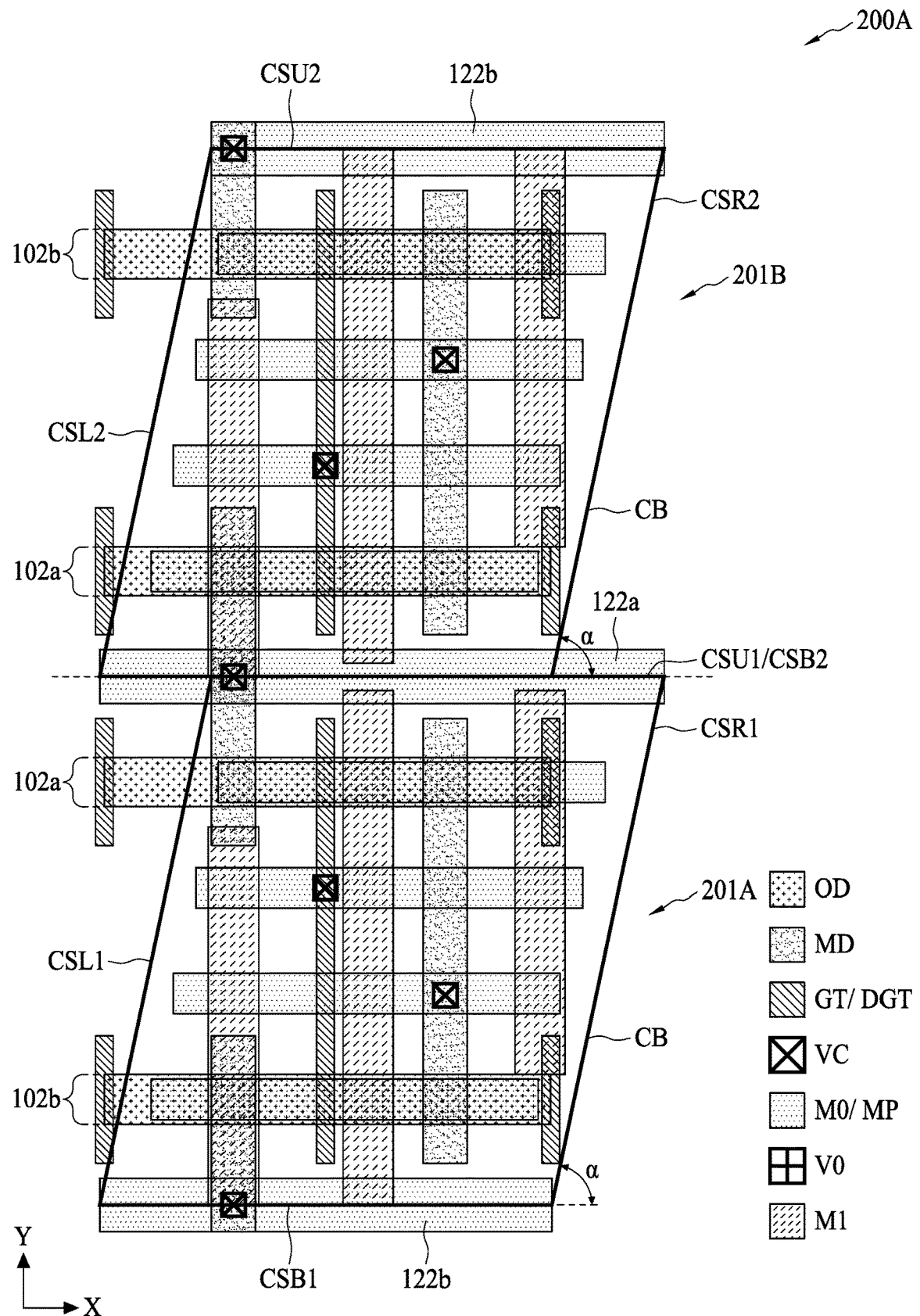
FIGS. 2A to 2B are schematic diagrams of design layouts in accordance with some embodiments of the present disclosure.

FIG. 2A is a schematic diagram of a design layout 200A in accordance with some embodiments of the present disclosure. The design layout 200A illustrates cells 201A and 201B arranged in different rows of the design layout 200A and abutted in the column direction.

In some embodiments, the cell 201A implements an inverter gate device and has a similar configuration to that of the cell 100A. In some embodiments, the cell 201B also implements an inverter gate device and has many aspects similar to those of the cell 201A. A major difference between the cells 201A and 201B lies in that the locations of the power rails 122a and 122b are swapped in the cell 201B, in which the power rails 122a and 122b are configured to supply the first voltage and the second voltage, respectively. The cell 201A has power rails 122a and 122b aligned with the respective upper cell side CSU1 and the lower cell side CSB1 of the cell 201A, while the cell 201B has a power rail 122a aligned with the lower cell side CSB2 of the cell 201B, in which the cells 201A and 201B share the power rail 122a, and a power rail 122b aligned with the upper cell side CSU2 of the cell 201B.

In some embodiments, the locations of the active region 102a or 102b in the cell 201B may be interchanged with the locations of the active regions 102a or 102b in the cell 201A in order to accommodate the swap of the power rails 122a and 122b. In some embodiments, the locations of the conductive lines or conductive vias in the cell 201A may need modification in adaptation to the new locations of the power rails 122a and 122b in the cell 201B. Persons having ordinary skill in the art would arrive at various layouts of the conductive lines and conductive vias of the cell 201B based on the configuration of the cell 201A, and thus these modified layouts are within the contemplated scope of the present disclosure.

In some embodiments, the cells 201A and 201B have respective left cell sides CSL1, CSL2 and respective right cell sides CSR1, CSR2, in which the left cell sides CSL1, CSL2 and the right cell sides CSR1, CSR2 are parallel to each other. In some embodiments, an included angle α between the x-axis and the left cell side CSL2 or between the x-axis and the right cell side CSR2 of the cell 201B, substantially equal to the inclined angle between the x-axis and the left cell side CSL1 or between the x-axis and the right cell side CSR1 of the cell 201A.

In some embodiments, after the cells 201A and 201B are abutted, their respective dummy gate electrodes 106 are aligned with each other in the column direction. In some embodiments, after the cells 201A and 201B are abutted, their respective gate electrodes 104 are aligned with each other in the column direction. In some embodiments, after the cells 201A and 201B are abutted, their respective gate-layer conductive lines 108 or conductive lines 132 are aligned with each other in the column direction.

Figure 2B:
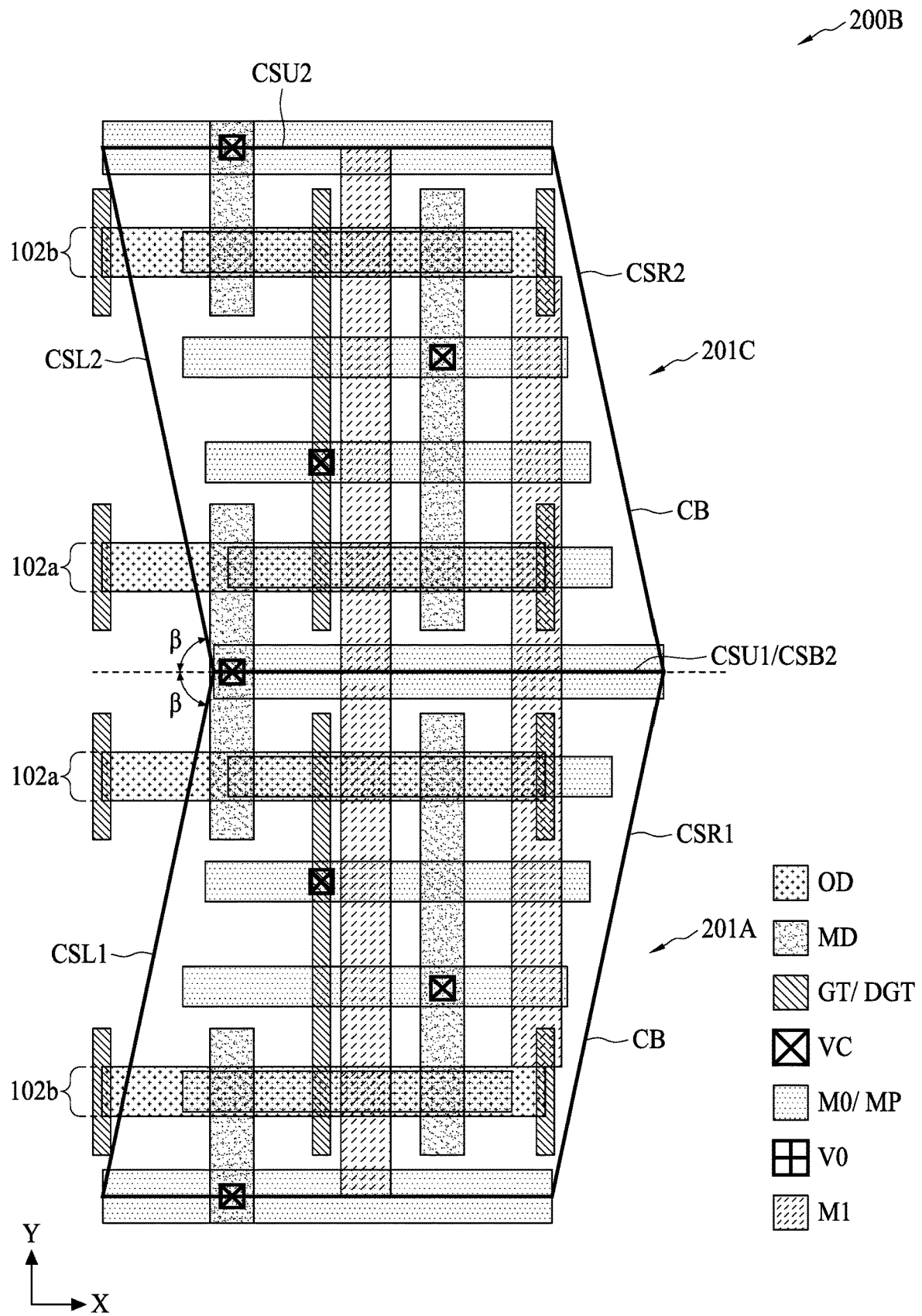

FIG. 2B is a schematic diagram of a design layout 200B, in accordance with some embodiments of the present disclosure. The design layout 200B illustrates cells 201A and 201C arranged in different rows and abutted in the column direction. In some embodiments, the cell 201C implements an inverter gate device similar that of the cell 201A and has many aspects similar to those of the cell 201A. Referring to FIGS. 2A and 2B, the cell 201C is regarded as a mirrored cell of the cell 201A with respect to the upper cell side CSU1 of the cell 201A. In some embodiments, the features of the cell 201C are symmetrical to those of the cell 201A with respect to the centerline of the power rail 122a. In some embodiments, the power rails 122a and 122b of the cell 201C are swapped with respect to the cell 201A.

In some embodiments, the cells 201A and 201C have respective left cell sides CSL1, CSL2 and respective right cell sides CSR1, CSR2, in which the two left cell sides CSL1, CSL2 or the two right cell sides CSR1, CSR2 are symmetrical with respect to the upper cell side CSU1 of the cell 100A. In some embodiments, the left (right) cell side CSL1 (CSR1) of the cell 201A is inclined toward a first direction (e.g. positive x-axis) opposite to that (negative x-axis) toward which the left (right) cell side CSL2 (CSR2) of the cell 201C is inclined. In some embodiments, an included angle β, measured between the x-axis and the left cell side CSL2 or the right cell side CSU2 of the cell 201B, substantially equal to the inclined angle measure between the x-axis and the left cell side CSL1 or the right cell side CSU1 of the cell 201A.

Figure 3A:
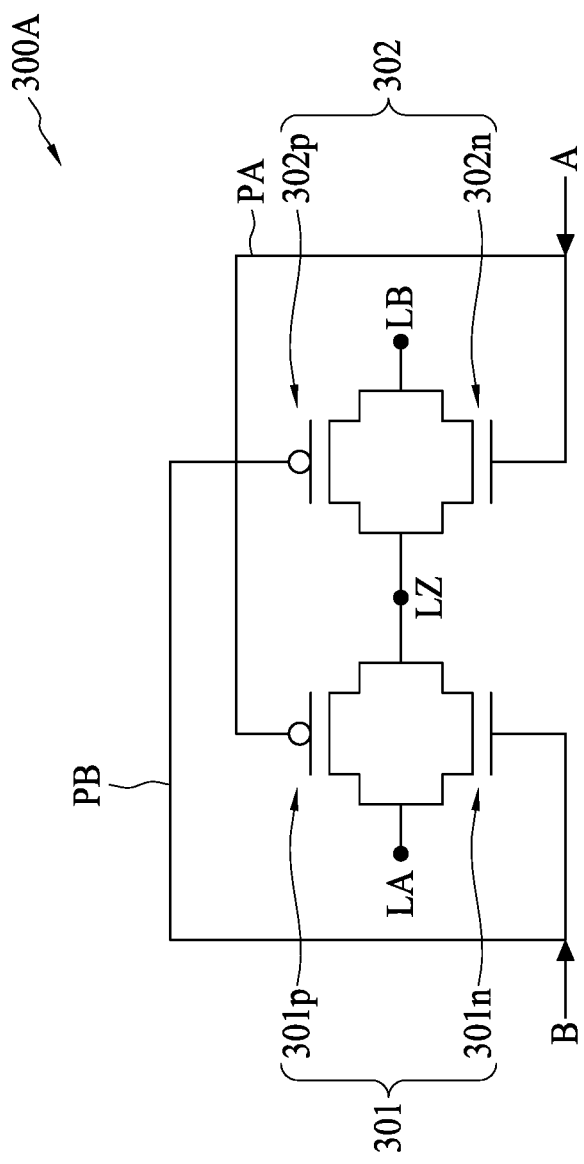
FIG. 3A is a circuit diagram of a semiconductor device, in accordance with some embodiments of the present disclosure.

FIG. 3A is a circuit diagram of a semiconductor device 300A, in accordance with some embodiments of the present disclosure. In some embodiments, the semiconductor device 300A is a transmission gate device and includes two pairs of FET devices 301 and 302. The FET device 301 is constructed by a first gate device formed of a P-type FET device 301p and an N-type FET device 301n. In which one source/drain region of the FET device 301p is connected to one source/drain region of the FET device 301n at a connection port LZ. The FET device 302 is constructed by a second gate device formed of a P-type FET device 302p and an N-type FET device 302n, in which one source/drain region of the FET device 302p is connected to one source/drain region of the FET device 302n at the connection port LZ.

A first control signal A is provided to the gate terminals of the FET devices 301p and 302n, and a second signal B is provided to the gate terminals of the FET devices 301n and 302p. In some embodiments, the first control signal A and the second control signal B are complementary to each other. The semiconductor device 300A includes a first data port LA and a second data port LB on outer sides of the semiconductor device 300A opposite to the connection port LZ. The data signal that is allowed into the connection port LZ may be selected between the data ports LA and LB according to the states of the control signals A and B.

Figure 3B:
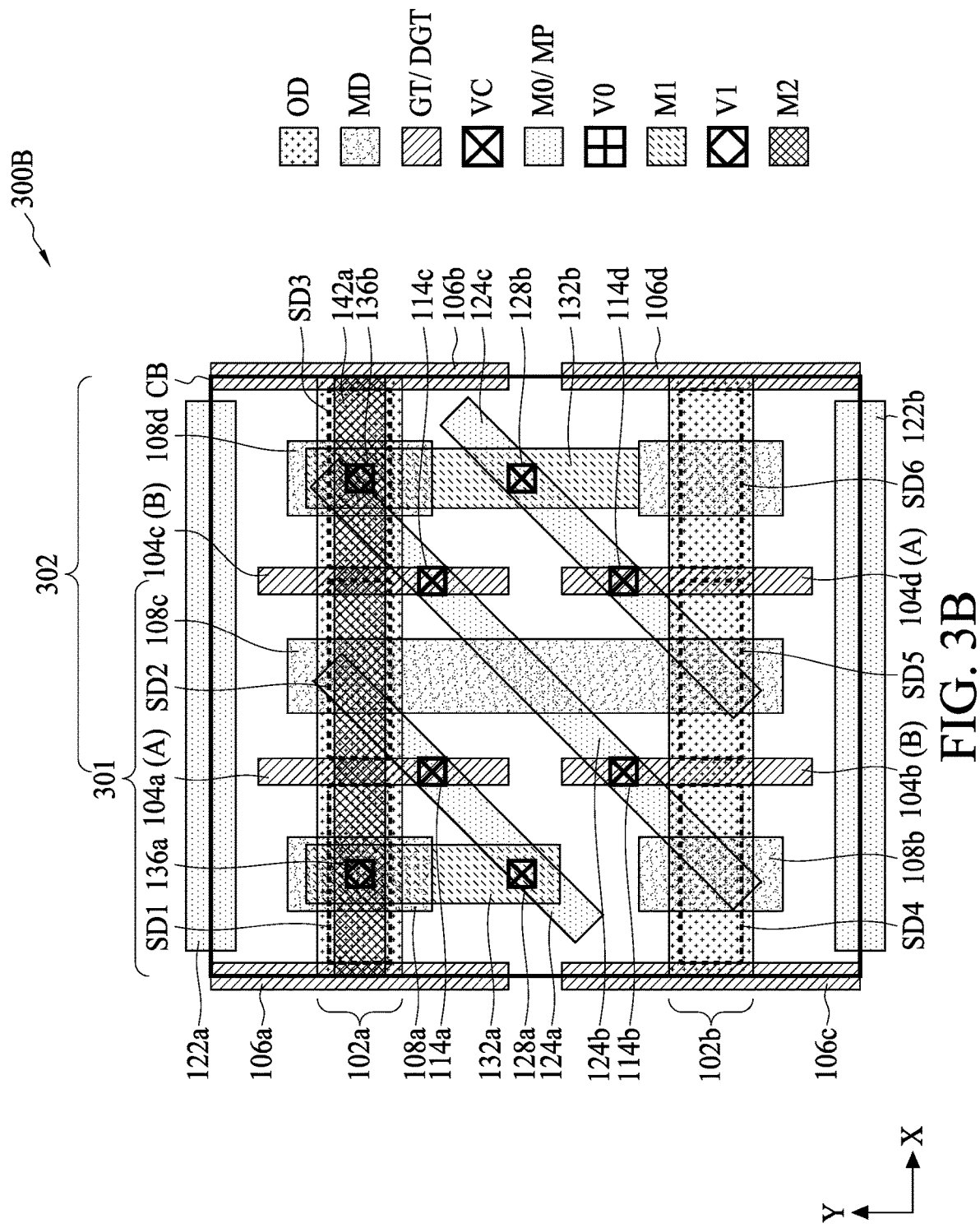
FIGS. 3B to 3D are schematic diagrams of design layouts of standard cells for the circuit diagram shown in FIG. 3A, in accordance with some embodiments of the present disclosure.
Figure 3C:
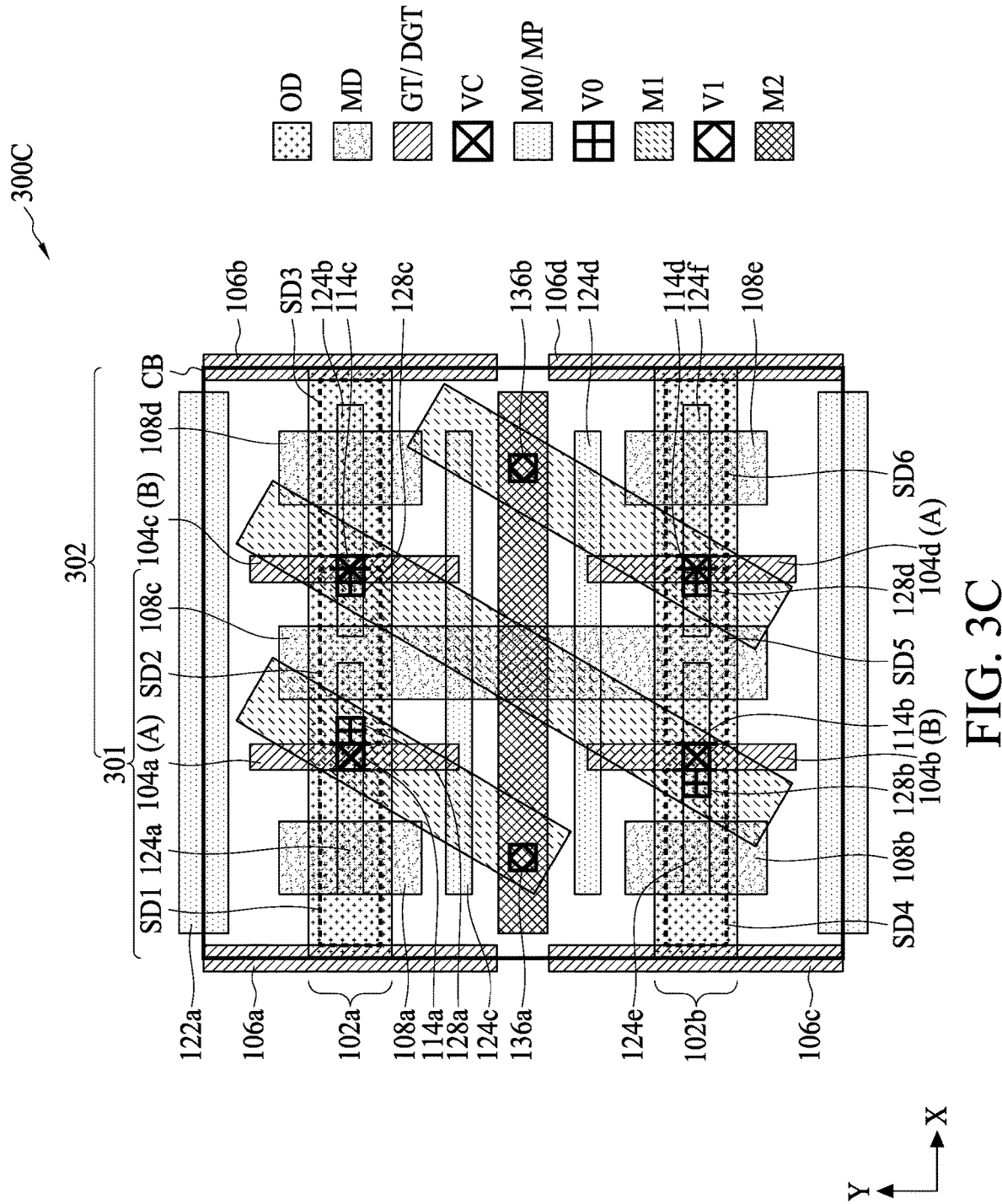
Figure 3D:
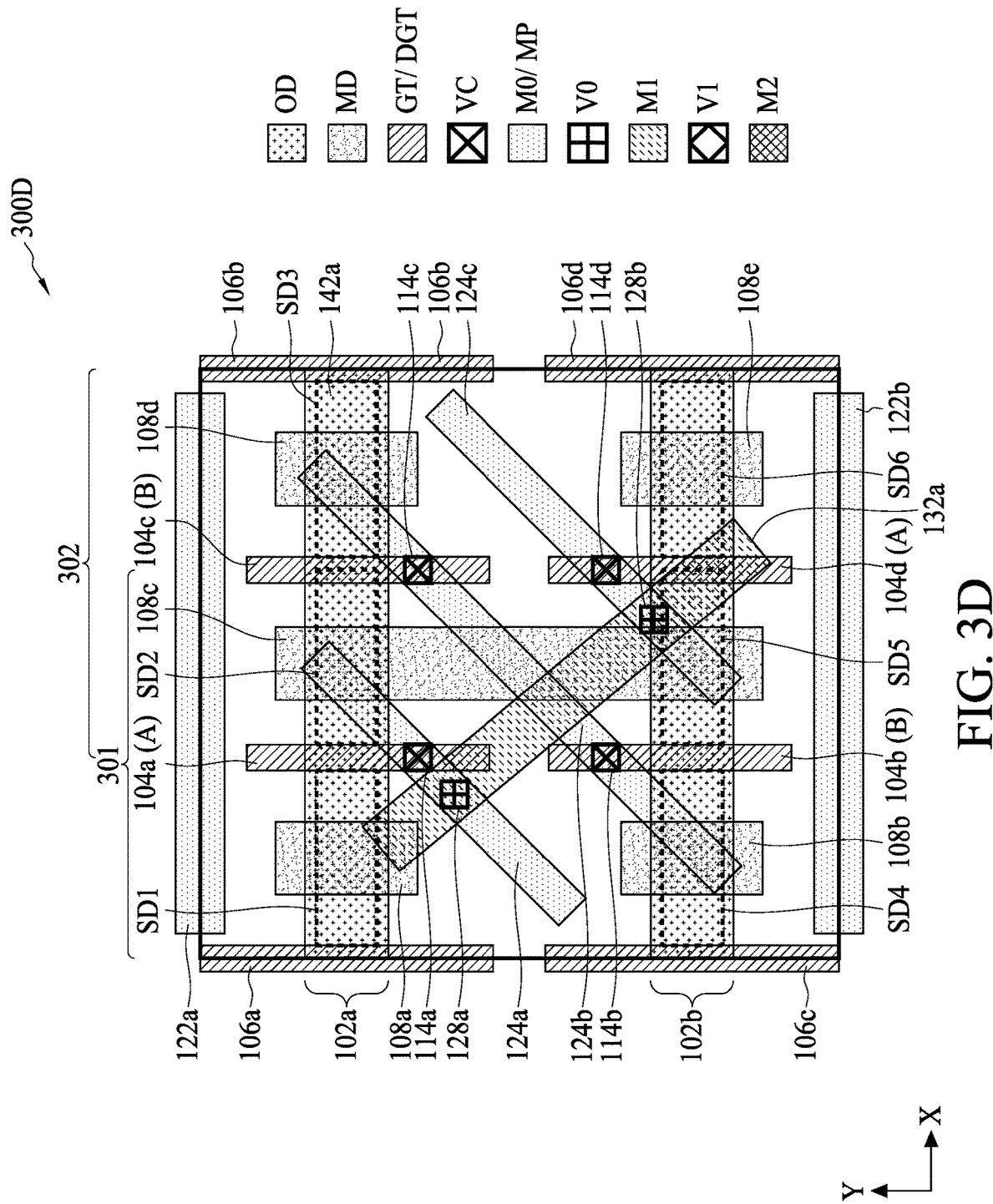

FIGS. 3B, 3C and 3D are schematic diagrams of design layouts of cells 300B, 300C and 300D, respectively, for the semiconductor device 300A in FIG. 3A, in accordance with some embodiments of the present disclosure. The cells 300B, 300C and 300D includes several features similar to those shown with references to the cells 100A and 100C, and therefore their detailed descriptions may be omitted for brevity.

Referring to FIG. 3B, the cell 300B includes active regions 102a and 102b, gate electrodes 104a, 104b, 104c and 104d, dummy gate electrodes 106a, 106b, 106c and 106d, gate-layer conductive line 108a, 108b, 108c, 108d and 108e, conductive lines 124a, 124b and 124c, conductive lines 132a and 132b, conductive line 142a, conductive vias 114a, 114b, 114c and 114d, conductive vias 128a and 128b and conductive vias 136a and 136b.

As shown in FIG. 3B, the cell boundary CB of the cell 300B is defined by the dummy gate electrodes 106, which extend in the column direction. As such, a major difference between the cells 100A and 100C and the cell 300B lies in that the cell 300B are in a rectangular shape. Further, the conductive lines 124 shown in FIG. 3B extend in a direction nonparallel to the x-axis and the y-axis. In other words, the conductive lines 124 in FIG. 3B are arranged in a non-orthogonal manner. Therefore, the cell 300B is a variant of the non-orthogonal cell structure of the cell 100A or 100C. The conductive lines 124 may extend in a direction that forms an inclined angle between the x-axis or the y-axis. In some embodiments, the conductive lines 124 forms an included angle with the x-axis or the y-axis, in which the angle is different from 90 degrees, e.g., between about 15 degrees and about 75 degrees, or between about 30 degrees and about 60 degrees.

The gate electrodes 104a, 104b, 104c and 104d correspond to the gate terminals of the FET device 301p, 301n, 302p and 302n, respectively. The gate electrodes 104 and the dummy gate electrodes 106 define portions of the active regions 102a, 102b as source/drain regions SD1, SD2, SD3, SD4, SD5 and SD6, in which the source/drain regions SD1 and SD4 correspond to the data port LA, the source/drain regions SD3 and SD6 correspond to the data port LB, and the source/drain regions SD2 and SD5 correspond to the connection port LZ.

Referring to FIGS. 3A and 3B, a first control path PA in FIG. 3A between the gate terminals of the FET devices 301p and 302n is implemented in FIG. 3B through a conduction path formed between the electrode gates 104a and 104d through the conductive via 114a, the conductive line 124a, the conductive via 128a, the conductive line 132a, the conductive via 136a, the conductive line 142a, the conduc-tive via 136b, the conductive line 132b, the conductive via 128b, the conductive line 124c and the conductive via 104d.

Referring to FIGS. 3A and 3B, a second control path PB in FIG. 3A between the gate terminals of the FET devices 301n and 302p is implemented in FIG. 3B through a conduction path formed between the electrode gates 104b and 104c through the conductive via 114b, the conductive line 124b and the conductive via 114c.

Through the non-orthogonal arrangement of the conductive lines 124a, 124b and 124c, the conduction paths for forming the control paths PA and PB can be implemented by interconnected conductive lines 124 where the included angles between the conductive lines 124 and the gate electrodes 104 or between the conductive lines 124 and the conductive lines 132 may not be at a right angle. As a result, the routing resource is saved as compared to an orthogonal interconnect structure where the angles between interconnected conductive lines need to be at a right angle.

FIG. 3C illustrates an alternative arrangement of the control paths PA and PB in the cell 300C. Referring to FIGS. 3B and 3C, the cell 300C is different from the cell 300B in that the conductive lines 124a, 124b, 124c, 124d, 124e and 124f in the cell 300C are parallel to the x-axis, while the conductive lines 132a, 132b and 132c in the cell 300C are arranged to be nonparallel to the x-axis or the y-axis; therefore, the cell 300C also has a non-orthogonal cell structure. In some embodiments, the conductive line 124b crosses the gate electrodes 104b and 104c and the gate-layer conductive line 108c.

In some embodiments, the first control path PA in FIG. 3A between the gate terminals of the FET devices 301p and 302n is implemented in FIG. 3C through a conduction path formed between the electrode gates 104a and 104d through the conductive via 114a, the conductive line 124a, the conductive via 128a, the conductive line 132a, the conductive via 136a, the conductive line 142b, the conductive via 136b, the conductive line 132c, the conductive via 128d, the conductive line 124f and the conductive via 114d.

In some embodiments, the second control path PB in FIG. 3A between the gate terminals of the FET devices 301n and 302p is implemented in FIG. 3C through a conduction path formed between the electrode gates 104b and 104c through the conductive via 114b, the conductive line 124e, the conductive via 128b, the conductive line 132b, the conductive via 128c, the conductive line 124b and the conductive via 114c.

FIG. 3D illustrates yet another arrangement of the control paths PA and PB in the cell 300D. Referring to FIGS. 3B, 3C and 3D, the cell 300D is different from the cell 300B or 300C in that both of the conductive lines 124 and 132 in the cell 300D are arranged to be nonparallel to the x-axis and the y-axis; therefore, the cell 300D also has a non-orthogonal cell structure. In some embodiments, the conductive line 132a is arranged nonparallel to the conductive line 124a, 124b or 124c. In some embodiments, the conductive line 132a is arranged substantially orthogonal to the conductive line 124a, 124b or 124c. In some embodiments, the conductive line 132a crosses the gate electrodes 104a and 104d and the gate-layer conductive line 108c.

In some embodiments, the first control path PA in FIG. 3A between the gate terminals of the FET devices 301p and 302n is implemented in FIG. 3D through a conduction path formed between the electrode gates 104a and 104d through the conductive via 114a, the conductive line 124a, the conductive via 128a, the conductive line 132, the conductive via 128b, the conductive line 124c and the conductive via 114d.

In some embodiments, the second control path PB in FIG. 3A between the gate terminals of the FET devices 301n and 302p is implemented in FIG. 3D through a conduction path formed between the electrode gates 104b and 104c through the conductive via 114b, the conductive line 124b and the conductive via 114c.

Figure 3E:
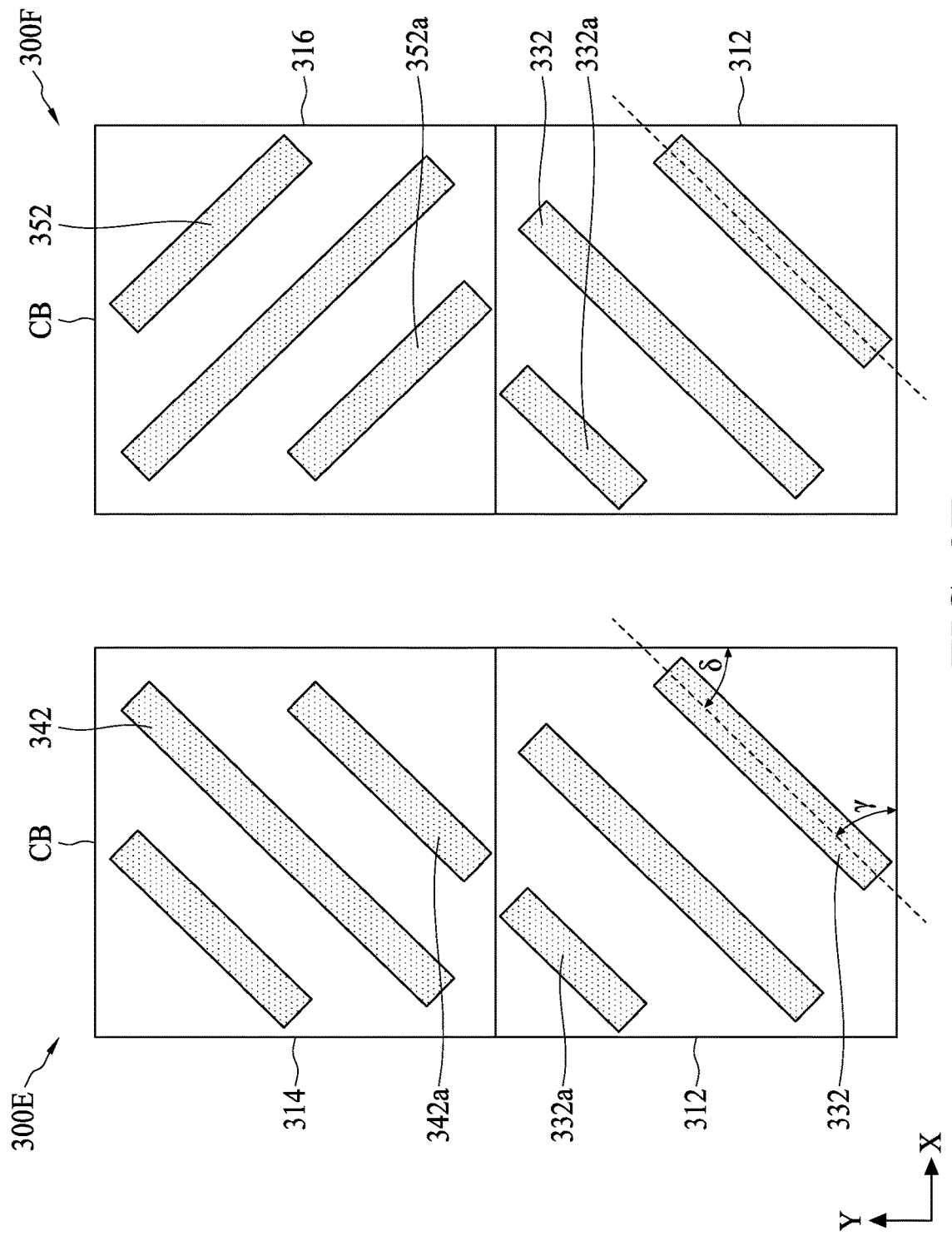
FIG. 3E is a schematic diagram showing arrangements of conductive lines in a design layout, in accordance with some embodiments of the present disclosure.

FIG. 3E shows schematic diagrams of design layouts 300E and 300F, in accordance with some embodiments of the present disclosure. Referring to the design layout 300E, a cell 312 abuts a cell 314 in the column direction along the y-axis. Most of the features of the cells 312 and 314 are omitted from the design layout 300E and only conductive lines 332 and 342 are shown for the cells 312 and 314, respectively, for brevity. In some embodiments, the cells 312 and 314 are identical cells.

The conductive lines 332 and 342 may represent the conductive lines 124, 132, 142 in the respective conductive line layer L3, L5, L7 or conductive lines in a higher layer in the interconnect structure as shown in FIG. 1B. The conductive lines 332 and 342 are arranged orthogonal to neither the x-axis nor the y-axis. In some embodiments, the conductive lines 332 are parallel or nonparallel to the conductive lines 342. In some embodiments, a longitudinal axis of a conductive line 332a in the cell 312 is aligned with a longitudinal axis of a conductive line 342a in the cell 314.

In some embodiments, an included angle γ between the x-axis and the conductive line 332 or 342 is between about 15 degrees and about 75 degrees or between about 30 degrees and about 60 degrees. In some embodiments, an included angle δ between the y-axis and the conductive line 332 or 342 is between about 15 degrees and about 75 degrees or between about 30 degrees and about 60 degrees.

Referring to the design layout 300F, the cell 312 abuts a cell 316 in the column direction along the y-axis. Most of the features of the cells 312 and 316 are omitted from the design layout 300F and only conductive lines 332 and 352 are shown for the cells 312 and 316, respectively, for brevity.

The conductive lines 352 may represent the conductive lines 124, 132 and 142 in the conductive line layer L3, L5, L7 or the conductive lines in a higher layer in the interconnect structure as shown in FIG. 1B. The conductive lines 352 are arranged orthogonal to neither the x-axis nor the y-axis. In some embodiments, the conductive lines 332 and 352 are mirrored to each other with respect to the x-axis. In some other embodiments, the conductive lines 352 are mirrored to the conductive lines 342 with respect to the y-axis. In some embodiments, a conductive line 332a in the cell 312 is substantially orthogonal to a conductive line 352a in the cell 316.

Figure 4:
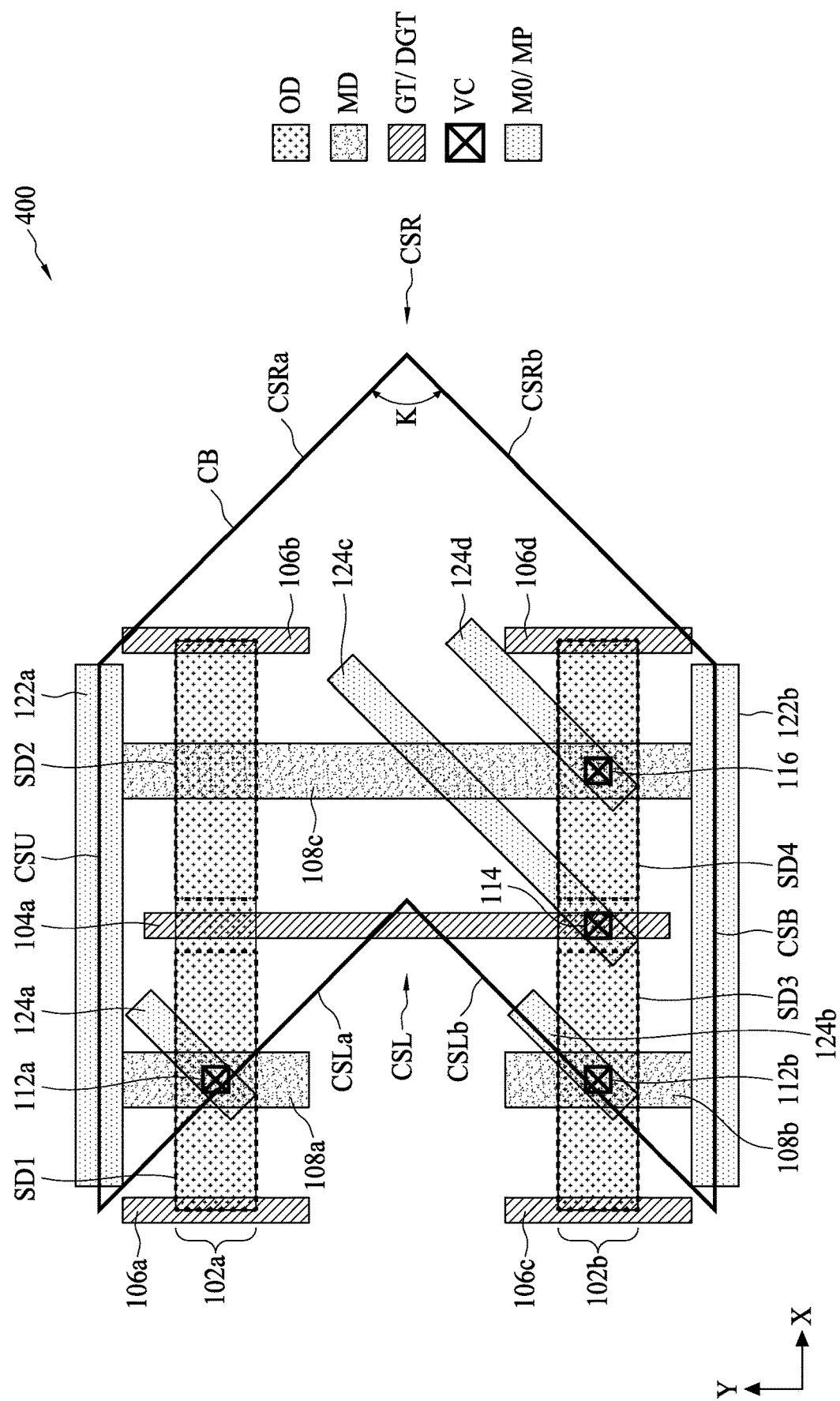
FIG. 4 is a schematic diagram of a design layout of a standard cell, in accordance with some embodiments of the present disclosure.

FIG. 4 is schematic diagram of a design layout of a cell 400, in accordance with some embodiments of the present disclosure. In some embodiments, the cell 400 is used for manufacturing an electronic circuit, such as an inverter gate, or other suitable logic gate devices such as a NAND gate, an XOR gate, an AND gate, a NOR gate, an AND-OR-Inverter (AOI) gate. The cell 400 includes several features similar to those of the cell 100A, and their detailed descriptions are omitted for brevity.

Referring to FIG. 1A and FIG. 4, the cell 400 is different from the cell 100A in that the cell boundary CB of the cell 400 includes a left cell side CSL and a right cell side CSR, in which the cell side CSL or CSR is formed of more than one nonparallel cell side segments CSLa, CSLb, CSRa and CSRb. In some embodiments, an included angle κ between the cell side segments CSLa and CSLb or between the cell side segments CSRa and CSRb can be an acute angle, a right angle or an obtuse angle, and may be in a range between about 30 degrees and between 150 degrees. In some embodiments, at least one cell side of the boundary CB of the cell 400 includes a corner. Since the boundary CB of the cell 400 is in a non-rectangular shape, the cell 400 is thus referred to as a non-orthogonal cell.

In some embodiments, the cell 400A further differs from the cell 100A in that the parallel conductive lines 124 extend in a direction nonparallel to the row direction (along the x-axis) and the column direction (along the y-axis), in a manner similar to the arrangement of the cell 300B, 300C or 300D. In some embodiments, the conductive lines 124a, 124b, 124c and 124d are parallel to one of the cell side segments CSLa, CSLb, CSRa and CSRb. In this connection, the cell 400 is also referred to as a non-orthogonal cell. In some embodiments, the left cell side CSL, e.g., the segment CSLa or CSLb, crosses or overlaps the gate electrode 104a.

Although the cell 400 is formed in a different shape from that of the cell 100A, the actual cell area of the cell 400 is substantially equal to the cell area of the cell 100A. Further, by help of the non-orthogonal arrangement of the conductive lines 124, the conductive lines (e.g., conductive lines 124 and 132) in different layers can be interconnected in a non-orthogonal way with greater efficiency, and the required number of conductive lines can be reduced.

Figure 5:
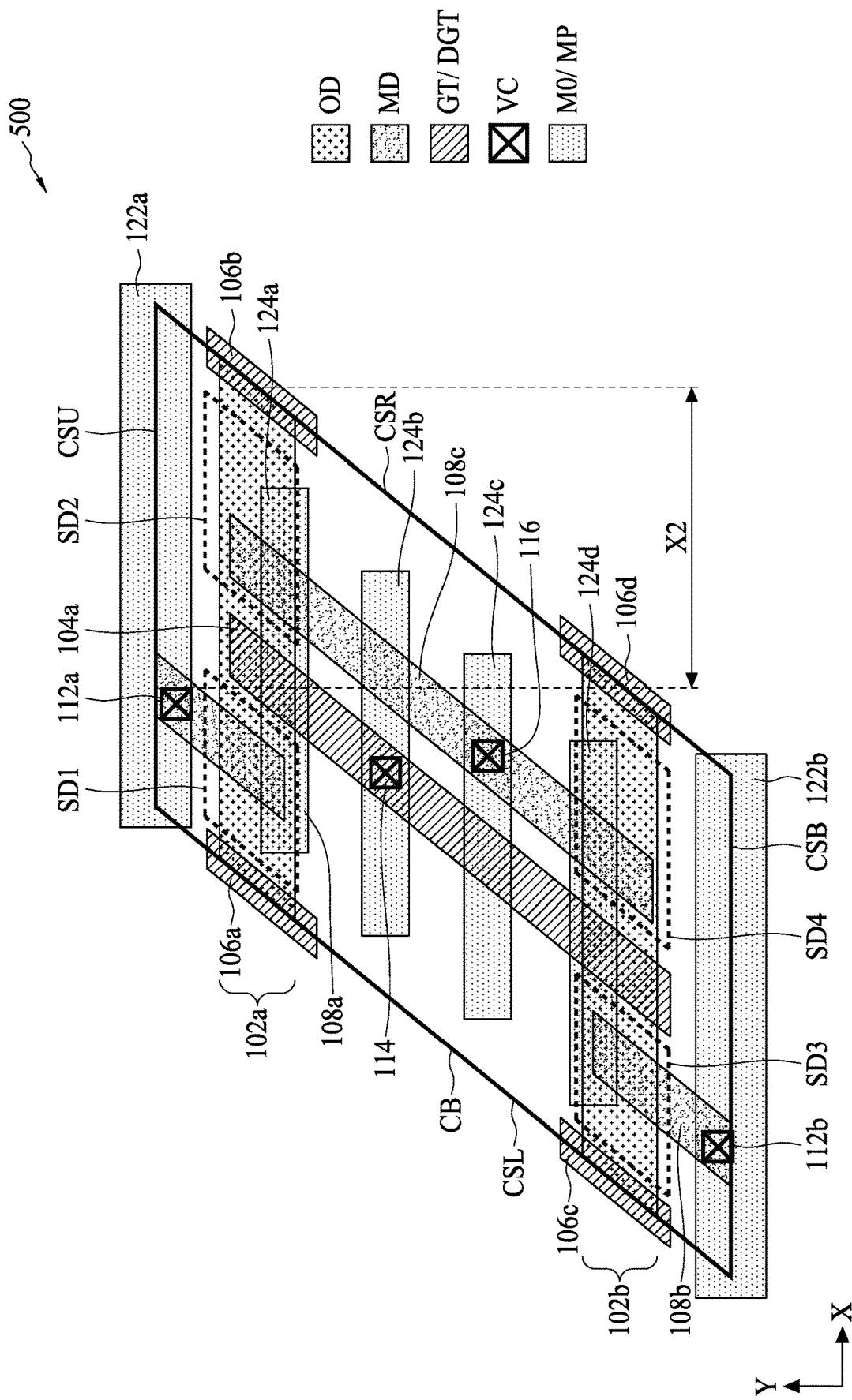
FIG. 5 is a schematic diagram of a design layout of a standard cell, in accordance with some embodiments of the present disclosure.

FIG. 5 is a schematic diagram of a design layout of a cell 500, in accordance with some embodiments of the present disclosure. In some embodiments, the cell 500 is used for manufacturing an electronic circuit, such as an inverter gate, or other suitable logic gate devices such as a NAND gate, an XOR gate, an AND gate, a NOR gate, an AND-OR-Inverter (AOI) gate. The cell 500 includes several features similar to those of the cell 100A, and their detailed descriptions are omitted for brevity.

Referring to FIG. 1A and FIG. 5, the cell 500 is different from the cell 100A in that all of the features of the cell 500, including the transistor layer, are within the cell boundary CB defined by left cell side CSL and the right cell side CSR. The dummy gate electrodes 106a, 106b, 106c and 106d are arranged on the left cell side CSL or the right cell side CSR. In some embodiments, the features of the cell 500 in the substrate layer L0, such as the active region 102a and 102b, source/drain regions SD1, SD2, SD3 and SD4, or the features in the gate layer L1, such as the electrode gate 104a, the dummy gate electrodes 106a, 106b, 106c and 106d, and the gate-layer conductive lines 108a, 108b and 108c are formed in a parallelogram shape from a top-view perspective. In some embodiments, the left (right) side of the active region 102a is offset from the left (right) side of the active region 102b by a distance X2 in adaptation to the parallelogram shape of the cell 600. In some embodiments, the features of the cell 500 in the substrate layer L0 or the features in the gate layer L1 extend in a direction nonparallel to the x-axis and the y-axis; therefore, the cell 500 is referred to as a non-orthogonal cell.

In some embodiments, the features of the cell 500 in the substrate layer L0 or the gate layer L1 are formed such that the sides of these feature are parallel to the respective cell sides CSU, CSB, CSL and CSR of the cell boundary of the cell 500. In some other embodiments, the features of the cell 500 in the substrate layer L0 or the gate layer L1 are formed such that the left and right line sides extending in the direction along the y-axis, in a manner similar to that shown in the cell 100A. In some embodiments, the power rails 122 and the conductive lines 124 have left and right line sides extending in the direction along the y-axis, in a manner similar to that shown in the cell 100A.

Figure 6:
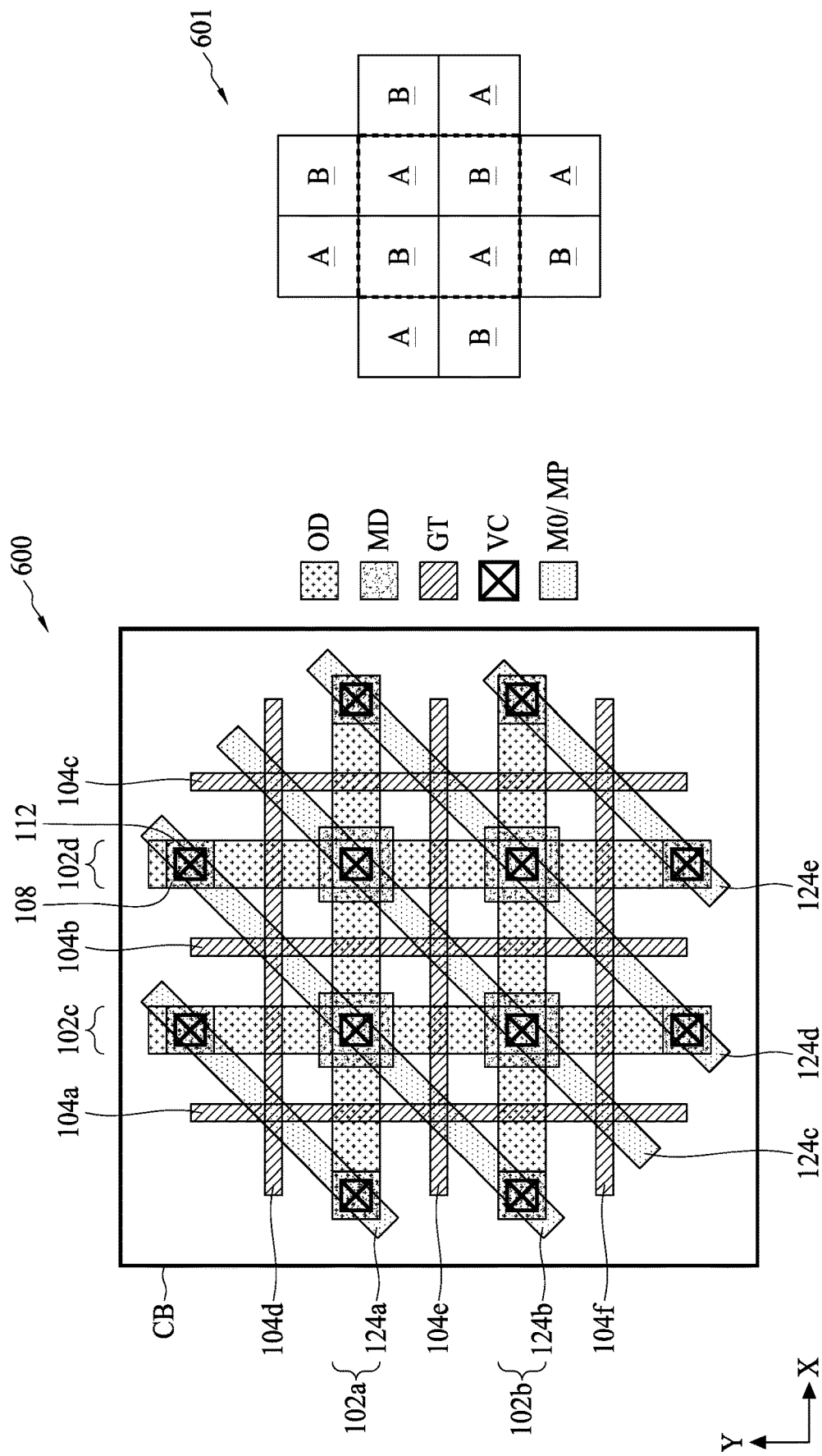
FIG. 6 is a schematic diagram of a design layout of a standard cell, in accordance with some embodiments of the present disclosure.

FIG. 6 is a schematic diagram of a design layout of a cell 600, in accordance with some embodiments of the present disclosure. Referring to FIG. 6, the cell 600 includes active regions 102a, 102b, 102c and 102d, in which the active regions 102a and 102b extend in the row direction while the active regions 102c and 102d extend in the column direction. The active regions 102 form a crisscross structure, in which the active regions 102a and 102b cross the active regions 102c and 102d. In some embodiments, the active regions 102a, 102b, 102c and 102d have the same conductivity type, such as P-type or N-type. The cell 600 also includes gate electrodes 104a, 104b, 104c, 104d, 104e and 104f between the active regions 102. The gate electrodes 104a, 104b and 104c extend in the column direction while the gate electrodes 104e, 104f and 104g extend in the row direction. The gate electrodes 104 form another crisscross structure, in which the gate electrodes 104a, 104b and 104c cross the gate electrodes 104d, 104e and 104f. In some embodiments, all of the gate electrodes 104 are activated or inactivated through a same control signal.

The active regions 102 and the gate electrodes 104 are alternatingly arranged to define a grid of source/drain regions A and B, as illustrated in a diagram 601 at the right of FIG. 6. Referring to the diagram 601, the source/drain regions have a first type source/drain region A, e.g., a source region, and a second type source/drain region B, e.g., a drain region. A pair of source/drain regions A and B adjacent to each other in either the row direction or the column direction is configured to form a FET device in conjunction with one electrode gate 104 between the corresponding source/drain region pair A/B. As a result, a total of twelve FET devices are formed in the cell 600. However, other numbers of FET devices less than or greater than twelve are also within the contemplated scope of the present disclosure.

The cell 600 further includes conductive lines 124a, 124b, 124c, 124d and 124e arranged in a conductive line layer L3 over the active regions 102 and the gate electrodes 104. The conductive lines 124 are arranged in parallel. In some embodiments, the conductive lines 124 extend in a direction nonparallel to the row direction and the column direction. In some embodiments, the conductive lines 124 in the cell 600 are arranged in a manner similar to the conductive lines 124 or 132 of the cells 300B to 300D. In some embodiments, the cell 600 includes twelve gate-layer conductive lines 108 arranged in the gate layer L1 and twelve conductive vias 112 arranged in the conductive via layer L2, in which a source/drain region A or B is electrically connected to a conductive line 124 through the corresponding gate-layer conductive line 108 and the conductive via 112.

In some embodiments, the cell 600 is used to implement a header switch or a footer switch. In some embodiments, all of the FET devices in the cell 600 are activated or inactivated at the same time. In some embodiments, all of the FET devices in the cell 600 are activated or inactivated by a same control signal. Through the non-orthogonal arrangement of the conductive lines 124, one conductive line 124 in the layer L2 is sufficient to electrically connect two or more source/drain regions A or B in different FET devices without additional routing paths running through higher layers. For example, the conductive line 124a electrically connects two source/drain regions A while the conductive line 124b electrically connects three source/drain regions B. The routing efficiency of the non-orthogonal or crisscross-type cell 600 is improved accordingly over existing linear-type or orthogonal cell structure.

Further, as illustrated in the diagram 601, a dashed box in the center of the crisscross structure includes four source/drain regions A and B, each of which is laterally surrounded by other four source/drain regions A or B. As a result, these four source/drain regions A and B within the dashed box are used four times in forming source/drain pairs with their adjacent source/drain regions. The area utilization advantage is thus demonstrated.

Figure 7:
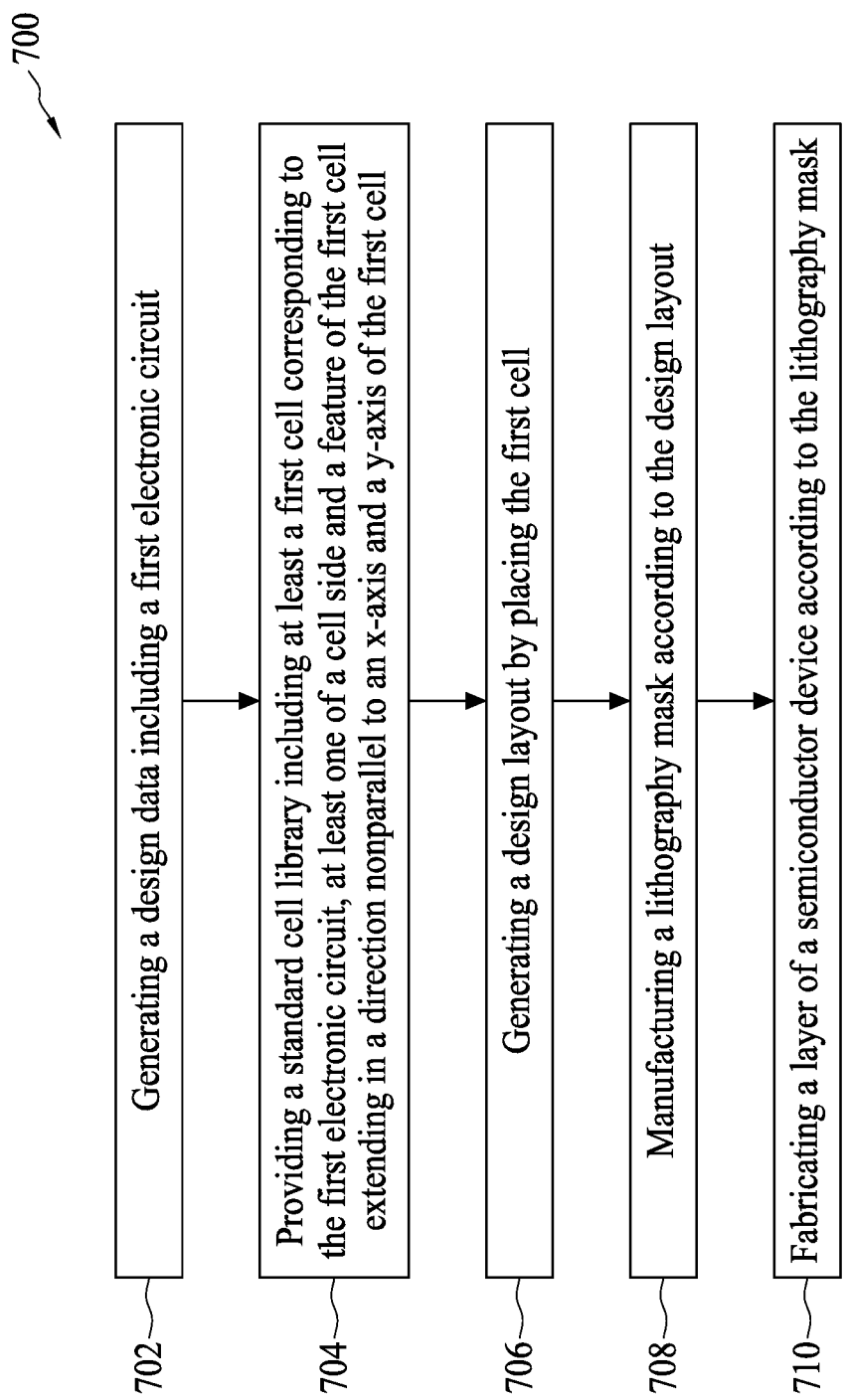
FIG. 7 is a flowchart of a layout method, in accordance with some embodiments of the present disclosure.

FIG. 7 is a flowchart of a layout method 700, in accordance with some embodiments of the present disclosure. It should be understood that additional steps can be provided before, during, and after the steps shown in FIG. 7, and some of the steps described below can be replaced or eliminated in other embodiments of the layout method 700. The order of the steps may be interchangeable.

At step 702, a design data is generated including a first electronic circuit. At step 704, a standard cell library is provided including a first cell corresponding to the first electronic circuit. At least one of a cell side and a feature (e.g., active region, gate electrode or conductive line) of the first cell extend in a direction nonparallel to an x-axis and a y a-axis of the first cell. In some embodiments, the first cell is a non-orthogonal cell. The first cell may be described with reference to FIGS. 1A, 1C, 3B, 3C, 3D, 4, 5 and 6.

At step 706, a design layout is generated by placing the first cell. At step 708, a lithography mask is manufactured according to the design layout. The design layout may be described with reference to FIGS. 1D, 2A, 2B and 3E.

At step 710, a layer of a semiconductor device is fabricated according to the lithography mask.

Figure 8A:
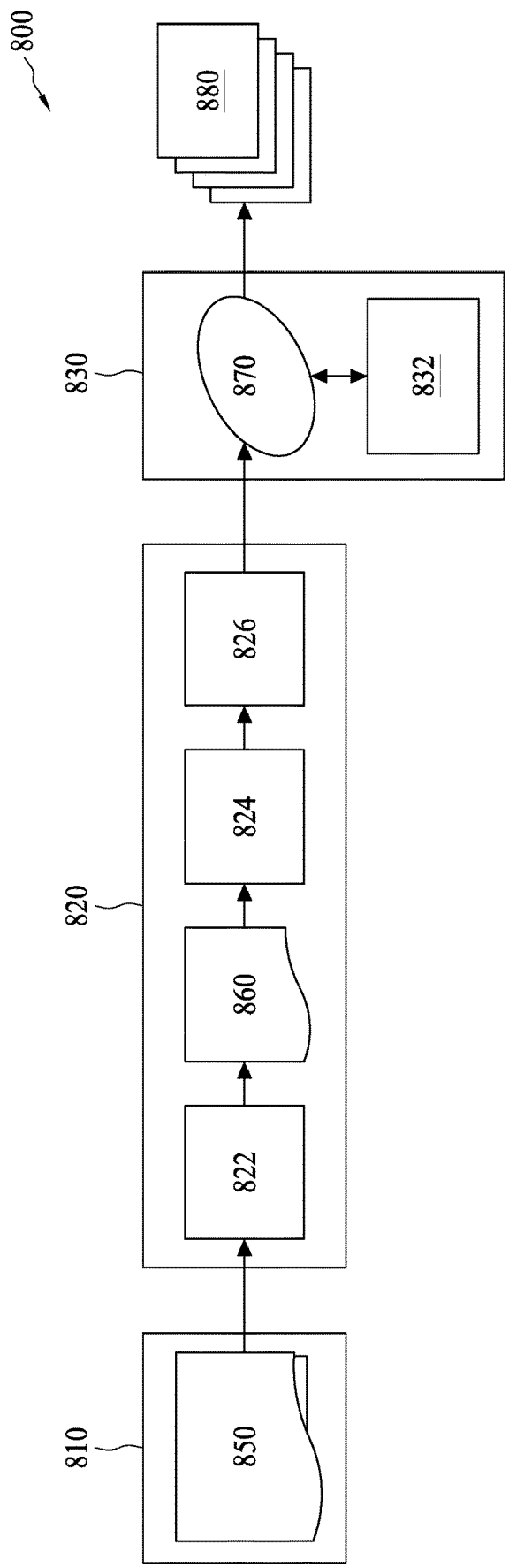
FIG. 8A is a schematic diagram showing an integrated circuit (IC) manufacturing system, in accordance with some embodiments of the present disclosure.

FIG. 8A is a schematic diagram 800 showing an integrated circuit (IC) manufacturing system, in accordance with some embodiments. The IC manufacturing system 800 is configured to manufacture an IC device 880 through a plurality of entities, such as a design subsystem 810, a mask subsystem 820, and a fabrication subsystem 830. The entities in the IC manufacturing system 800 may be linked by a communication channel, e.g., a wired or wireless channel, and interact with one another through a network, e.g., an intranet or the internet. In an embodiment, the design subsystem 810, the mask subsystem 820 and the fabrication subsystem 830 belong to a single entity, or are operated by independent parties.

The design subsystem (design house or layout design provider) 810 generates a design layout 850 in a design phase for the IC devices 880 to be fabricated. The design subsystem 810 may perform the layout methods discussed in the present disclosure to generate the design layout 850, e.g., the design layouts shown with reference to the figures of the present disclosure. In an embodiment, the design subsystem 810 operates a circuit design procedure to generate the design layout 850. The design subsystem 810 may include further one or more steps, such as logic design, physical design, pre-layout simulation, placement and routing, timing analysis, parameter extraction, design rule check and post-layout simulation, to generate the design layout 850. The design layout 850 may be converted from description texts into their visual equivalents to show a physical layout of the depicted patterns, such as the dimensions, shapes and locations thereof. In an embodiment, the design layout 850 can be expressed in a suitable file format such as GDSII, DFII, OASIS, or the like.

The mask subsystem 820 receives the design layout 850 from the design subsystem 810 and manufactures one or more masks (photomask, lithography masks or reticles) according to the design layout 850. In an embodiment, the mask subsystem 820 includes a mask data preparation block 822, a mask fabrication block 824 and a mask inspection block 826. The mask data preparation block 822 modifies the design layout 850 so that a revised design layout 860 can allow a mask writer to transfer the design layout 850 to a writer-readable format.

The mask fabrication block 824 is configured to fabricate the mask by preparing a substrate based on the design layout 860 provided by the mask data preparation block 822. A mask substrate is exposed to a radiation beam, such as an electron beam, based on the pattern of the design layout 860 in a writing operation, which may be followed by an etching operation to leave behind the patterns corresponding to the design layout 860. In an embodiment, the mask fabrication block 824 includes a checking procedure to ensure that the layout data 860 complies with requirements of a mask writer and/or a mask manufacturer to generate the mask as desired. An electron-beam (e-beam), multiple e-beams, an ion beam, a laser beam or other suitable writer source may be used to transfer the patterns.

After the lithography mask is fabricated, the mask inspection block 826 inspects the fabricated mask to determine if any defects, such as full-height and non-full-height defects, exist in the fabricated mask. If any defects are detected, the mask may be cleaned or the design layout in the mask may be modified.

The fabrication subsystem 830 is an IC manufacturing entity that includes multiple manufacturing facilities or tools for the fabrication of a variety of the IC devices 880. The fabrication subsystem 830 uses the mask fabricated by the mask subsystem 820 to fabricate a wafer 870 having a plurality of IC devices 880 thereon. The wafer 870 includes a semiconductor substrate and optionally various layers formed thereon. The operations provided by the manufacturing facilities or tools may include, but not limited to, photolithography, deposition, sputtering, etching, diffusion, ion implantation and annealing. In some embodiments, test structures may be formed on the wafer 870 to generate test data indicative of the quality of the fabricated wafer 870. In an embodiment, the fabrication subsystem 830 includes a wafer testing block 832 configured to ensure that the wafer 870 conforms to physical manufacturing specifications and mechanical and/or electrical performance specifications. After the wafer 870 passes the testing procedure performed by the wafer testing block 832, the wafer 870 may be diced (or sliced) along the scribe line regions to form separate IC devices 880. The dicing process can be accomplished by scribing and breaking, by mechanical sawing (e.g., with a dicing saw) or by laser cutting.

Figure 8B:
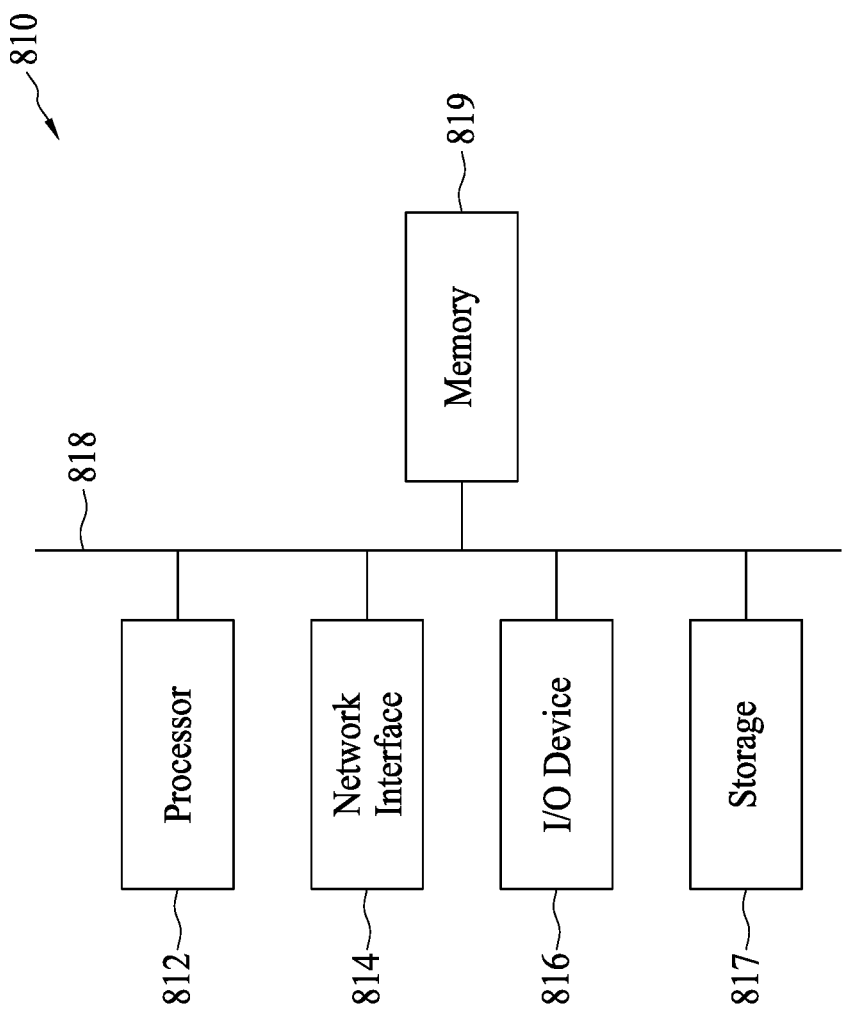
FIG. 8B is a schematic diagram of a design subsystem in the IC manufacturing system shown in FIG. 8A for generating a design layout, in accordance with some embodiments of the present disclosure.

FIG. 8B is a schematic diagram of the design subsystem 810 of the IC manufacturing system 800 shown in FIG. 8A for generating or storing the design layouts 850 discussed above, in accordance with some embodiments. In some embodiments, the design subsystem 810 is a computer system. The design subsystem 810 includes a processor 812, a network interface 814, an input and output (I/O) device 816, a storage device 817, a memory 819, and a bus 818. The bus 818 couples the network interface 814, the I/O device 816, the storage device 817, the memory 819 and the processor 88 to each other.

The processor 812 is configured to execute program instructions that include a tool configured to generate the design layouts as described and illustrated with reference to figures of the present disclosure.

The network interface 814 is configured to access program instructions and data accessed by the program instructions stored remotely through a network (not shown).

The I/O device 816 includes an input device and an output device configured for enabling user interaction with the circuit design subsystem 810. In some embodiments, the input device includes, for example, a keyboard, a mouse, and other devices. Moreover, the output device includes, for example, a display, a printer, and other devices.

The storage device 817 is configured for storing the design layouts, program instructions and data accessed by the program instructions. In some embodiments, the storage device 817 includes a standard cell library for storing the data of the standard cells as discussed in the present disclosure. In some embodiments, the storage device 817 includes a non-transitory computer-readable storage medium, for example, a magnetic disk and an optical disk.

The memory 819 is configured to store program instructions to be executed by the processor 812 and data accessed by the program instructions. In some embodiments, the memory 819 includes any combination of a random-access memory (RAM), some other volatile storage device, a read-only memory (ROM), and some other non-volatile storage device.

According to an embodiment, a layout method, executed by at least one processor, includes: generating a design data comprising an electronic circuit, and generating a design layout by placing a first cell corresponding to the electronic circuit. The first cell includes a first source/drain region and a second source/drain region extending in a first direction in a first layer, a gate electrode extending in a second direction perpendicular to the first direction in a second layer over the first layer, wherein the first and second source/drain regions are disposed on opposite sides of the gate electrode, and a first conductive line arranged in a third layer over the second layer and electrically connected to one of the first source/drain region, the second source/drain region and the gate electrode. The first cell is defined a left cell side and a right cell side, wherein at least one of the left cell side, the right cell side, the gate electrode and the first conductive line extends in a third direction not parallel to the first direction and not parallel to the second direction.

According to an embodiment, a layout method, executed by at least one processor, includes generating a design data comprising an electronic circuit, and generating a design layout by placing a first cell. The first cell includes an active region extending in a first direction in a first layer, a first gate electrode extending in a second direction perpendicular to the first direction in a second layer over the first layer and crossing the active region, a first conductive line extending in a third direction in a third layer over the second layer, and a second conductive line extending in a fourth direction in a fourth layer over the third layer. At least one of the third direction and the fourth direction is different from the first and second directions.

According to an embodiment, a semiconductor device includes a cell. The cell includes a first source/drain region and a second source/drain region arranged in a first layer, a first gate electrode extending in a first direction in a second layer over the first layer, wherein the first and second source/drain regions are disposed on opposite sides of the first gate electrode, a first power rail extending in a second direction perpendicular to the first direction in a third layer over the second layer, a second power rail extending in the second direction on a side of the cell opposite to the first power rail, and a first conductive line extending in a third direction over the first layer. The third direction is nonparallel to the first direction and the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout method, executed by at least one processor, comprising:
   generating a design data comprising an electronic circuit; and
   generating a design layout by placing a first cell corresponding to the electronic circuit, wherein the first cell comprises:
      a first source/drain region and a second source/drain region extending in a first direction in a first layer;
      a gate electrode extending in a second direction perpendicular to the first direction in a second layer over the first layer, wherein the first and second source/drain regions are disposed on opposite sides of the gate electrode; and
      a first conductive line arranged in a third layer over the second layer and electrically connected to one of the first source/drain region, the second source/drain region and the gate electrode,
      wherein the first cell is defined by a left cell side and a right cell side, wherein at least one of the left cell side and the right cell side extends in a third direction not parallel to the first direction and not parallel to the second direction,
      wherein at least one of the first and second source/drain regions extends beyond one of the left and right cell sides.

2. The layout method according to claim 1, further comprising manufacturing a lithography mask according to the design layout.

3. The layout method according to claim 1, wherein the first cell is further defined by an upper cell side and a lower cell side, wherein the upper, lower, left and right cell sides form a parallelogram.

4. The layout method according to claim 1, wherein the first cell further includes a first dummy gate electrode and a second dummy gate electrode extending in the second direction in the second layer and arranged on two sides of the first source/drain region, wherein at least one of the first and second dummy gate electrodes is between the left and right cell sides.

5. The layout method according to claim 4, wherein the first conductive line extends in the second direction and overlaps at least one of the first and second dummy gate electrodes.

6. The layout method according to claim 1, wherein the first cell further comprises a first power rail and a second power rail extending in the first direction in the third layer, wherein the first power rail is offset from the second power rail in the second direction by a first distance.

7. The layout method according to claim 6, wherein the first cell comprises a cell length of a distance between the left cell side and the right cell side measured in the first direction, and the first distance is equal to or greater than one-third of the cell length.

8. The layout method of claim 6, wherein the first cell further comprises an upper cell side and a lower cell side, the upper cell side is aligned with a centerline of the first power rail, and the lower cell side is aligned with a centerline of the second power rail.

9. The layout according to claim 6, wherein the first cell further comprises a fifth conductive line extending in the second direction in the first layer and electrically connected to the first power rail and one of the first source/drain region and the second source/drain region.

10. The layout method according to claim 1, wherein the first cell further comprises a second conductive line extending in the third layer and parallel to the first conductive line, wherein the first and second conductive lines extend in the first or second direction.

11. The layout method according to claim 1, wherein the first cell further comprises a third conductive line arranged in a fourth layer different from the third layer and over the second layer, wherein the third conductive line extends in the second direction.

12. The layout method according to claim 1, wherein the first cell further comprises a first active region and a second active region extending in the first direction, wherein the first and second source/drain regions are formed within the first active region, and wherein a left side of the first active region is offset from a left side of the second active region by a second distance.

13. The layout method according to claim 1, wherein the first cell further comprises a substrate in a fourth layer beneath the first layer, the first source/drain region and the second source/drain region have an upper surface higher than an upper surface of the substrate and protrudes into the first layer.

14. A layout method, executed by at least one processor, comprising:
   generating a design data comprising an electronic circuit; and
   generating a design layout by placing a first cell corresponding to the electronic circuit, wherein the first cell comprises:
      a transistor layer comprising a gate electrode extending in a first direction, a plurality of source/drain regions arranged on either side of the gate electrode, and a plurality of conductive lines extending in the first direction and electrically connected to the plurality of source/drain regions; and
      an interconnect layer over the transistor layer and comprising a plurality of first data rails and a plurality of second data rails extending in the first direction or a second direction perpendicular to the first direction, wherein the plurality of first data rails are electrically connected to the gate electrode, and the plurality of second data rails are electrically connected to the plurality of conductive lines,
      wherein the interconnect layer is defined by a first boundary in a non-rectangular quadrilateral shape.

15. The layout method according to claim 14, wherein the transistor layer is defined by a second boundary in a rectangular shape.

16. The layout method according to claim 14, wherein:
   the transistor layer further comprises a plurality of dummy gates electrodes extending in the first direction in the second layer, and the first source/drain region and the second source/drain region are delimited by the gate electrode and the dummy gates electrodes; and
   the interconnect layer further comprises a first power rail and a second power rail extend in the second direction and electrically connected to the plurality of conductive lines.

17. A layout method, executed by at least one processor, comprising:
- generating a design data comprising an electronic circuit; and
- generating a design layout by placing a first cell corresponding to the electronic circuit, wherein the first cell comprises:
  - a first active region and a second active region each extending in a first direction in a first layer;
  - a gate electrode extending in a second direction different from the first direction in a second layer over the first layer;
  - a first source/drain region and a second source/drain region formed in the first active region and arranged on either side of the gate electrode;
  - a third source/drain region and a fourth source/drain region formed in the second active region and arranged on either side of the gate electrode;
  - a first conductive line extending in the second direction in the second layer and electrically connected to the second source/drain region and the fourth source/drain region; and
  - a plurality of second conductive lines arranged in a third layer over the second layer and electrically connected to one of the first source/drain region, the second source/drain region and the gate electrode,
  - wherein the first cell is defined by a left cell side and a right cell side, and the left cell side and the right cell side extend in a third direction not parallel to the first direction and not parallel to the second direction, and
  - wherein the first cell further comprises:
    - a plurality of dummy gate electrodes arranged in the first layer and extending in the second direction, and the plurality of dummy gate electrodes are arranged on either side of the first and second active regions; and
    - a plurality isolation structures formed in the first layer, and the first and second active regions are separated from each other by the isolation structure.

18. The layout method of claim 17, wherein the first cell is further defined by an upper cell side and a lower cell side parallel to the upper cell side, and the right cell side and the lower cell side forms an included angle is in range between about 15 degrees and about 75 degrees.

19. The layout method of claim 17, wherein the first cell further comprises a first power rail and a second power rail extending in the first direction in the third layer, wherein the first power rail is offset from the second power rail in the second direction by a distance.

20. The layout method of claim 17, wherein at least one of the dummy gate electrodes is between the left and right cell sides.

* * * * *